US009935017B2

(12) United States Patent
You et al.

(10) Patent No.: US 9,935,017 B2
(45) Date of Patent: Apr. 3, 2018

(54) METHODS OF MANUFACTURING SEMICONDUCTOR DEVICES BY FORMING SOURCE/DRAIN REGIONS BEFORE GATE ELECTRODE SEPARATION

(71) Applicant: Samsung Electronics Co., Ltd., Suwon-si, Gyeonggi-do (KR)

(72) Inventors: Jung-Gun You, Ansan-si (KR); Eung-Gwan Kim, Seongnam-si (KR); Jeong-Yun Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/489,782

(22) Filed: Apr. 18, 2017

(65) Prior Publication Data
US 2017/0221771 A1   Aug. 3, 2017

Related U.S. Application Data

(62) Division of application No. 14/803,893, filed on Jul. 20, 2015, now Pat. No. 9,659,827.
(Continued)

(30) Foreign Application Priority Data

Oct. 30, 2014   (KR) ........................ 10-2014-0149483

(51) Int. Cl.
*H01L 21/02* (2006.01)
*H01L 21/8238* (2006.01)
(Continued)

(52) U.S. Cl.
CPC .............. *H01L 21/823828* (2013.01); *H01L 21/02529* (2013.01); *H01L 21/02532* (2013.01);
(Continued)

(58) Field of Classification Search
CPC ..... H01L 21/823821; H01L 21/823878; H01L 21/76224; H01L 21/02233; H01L 21/308;
(Continued)

(56) References Cited

U.S. PATENT DOCUMENTS 7,074,662 B2   7/2006   Lee et al.
7,326,656 B2   2/2008   Brask .................... H01L 21/845
                                                    257/E21.442
(Continued)

FOREIGN PATENT DOCUMENTS

JP   2008-147366   6/2008
JP   2010-182751   8/2010
(Continued)

*Primary Examiner* — Savitr Mulpuri
(74) *Attorney, Agent, or Firm* — Ward and Smith, P.A.

(57) ABSTRACT

Spaced apart first and second fins are formed on a substrate. An isolation layer is formed on the substrate between the first and second fins. A gate electrode is formed on the isolation layer and crossing the first and second fins. Source/drain regions are formed on the first and second fins adjacent the gate electrode. After forming the source/drain regions, a portion of the gate electrode between the first and second fins is removed to expose the isolation layer. The source/drain regions may be formed by epitaxial growth.

10 Claims, 40 Drawing Sheets

Related U.S. Application Data

(60) Provisional application No. 62/026,948, filed on Jul. 21, 2014.

(51) Int. Cl.
　　*H01L 29/66* (2006.01)
　　*H01L 27/092* (2006.01)
　　*H01L 29/06* (2006.01)
　　*H01L 29/161* (2006.01)
　　*H01L 29/16* (2006.01)
　　*H01L 29/165* (2006.01)
　　*H01L 29/08* (2006.01)
　　*H01L 29/78* (2006.01)

(52) U.S. Cl.
　　CPC ........ *H01L 21/823814* (2013.01); *H01L 21/823821* (2013.01); *H01L 21/823878* (2013.01); *H01L 27/0924* (2013.01); *H01L 29/0653* (2013.01); *H01L 29/0847* (2013.01); *H01L 29/161* (2013.01); *H01L 29/165* (2013.01); *H01L 29/1608* (2013.01); *H01L 29/66545* (2013.01); *H01L 29/7848* (2013.01)

(58) Field of Classification Search
　　CPC ......... H01L 21/823828; H01L 27/0924; H01L 29/0649
　　See application file for complete search history.

(56) References Cited

U.S. PATENT DOCUMENTS

| | | | |
|---|---|---|---|
| 7,456,476 B2 | 11/2008 | Hareland | H01L 29/42384 257/349 |
| 7,719,043 B2 | 5/2010 | Yamagami et al. | |
| 7,923,337 B2 | 4/2011 | Chang et al. | |
| 8,008,751 B2 | 8/2011 | Irisawa | H01L 21/84 257/347 |
| 8,114,746 B2 | 2/2012 | Wei et al. | |
| 8,154,075 B2 | 4/2012 | Nakagawa | |
| 8,174,095 B2 | 5/2012 | Irisawa | H01L 21/84 257/347 |
| 8,278,179 B2 | 10/2012 | Lin | H01L 21/823821 257/E21.431 |
| 8,466,034 B2 | 6/2013 | Maszara et al. | |
| 8,557,692 B2 | 10/2013 | Tsai | H01L 21/26513 257/611 |
| 8,592,280 B2 | 11/2013 | Chang et al. | |
| 8,618,556 B2 | 12/2013 | Wu | H01L 21/823821 257/76 |
| 8,890,261 B2 | 11/2014 | Chang | H01L 29/66545 257/327 |
| 8,912,063 B2 | 12/2014 | Kim | H01L 29/66795 257/327 |
| 8,927,373 B2 | 1/2015 | Rodder | H01L 21/76 438/294 |
| 8,987,100 B2 | 3/2015 | Oh | H01L 29/66477 257/E21.002 |
| 9,349,651 B2 | 5/2016 | Kim | H01L 29/66545 |
| 9,349,730 B2 | 5/2016 | Jacob | H01L 27/0886 |
| 9,368,495 B2 | 6/2016 | Kim | H01L 27/0886 |
| 9,490,346 B2 | 11/2016 | Jangjian | H01L 29/66795 |
| 9,490,365 B2 | 11/2016 | Jangjian | H01L 29/785 |
| 9,502,538 B2 | 11/2016 | Jangjian | H01L 29/66795 |
| 9,536,881 B2 | 1/2017 | Maeda | H01L 27/0924 |
| 2011/0068407 A1 | 3/2011 | Yeh | H01L 21/823807 257/369 |
| 2012/0286337 A1 | 11/2012 | Liang | H01L 21/823431 257/288 |
| 2013/0109166 A1 | 5/2013 | Triyoso et al. | |
| 2013/0134506 A1 | 5/2013 | Yagishita | H01L 29/66545 257/330 |
| 2013/0187206 A1 | 7/2013 | Mor et al. | |
| 2013/0193526 A1 | 8/2013 | Lo et al. | |
| 2013/0256767 A1* | 10/2013 | Pradhan | H01L 29/78 257/288 |
| 2013/0285141 A1 | 10/2013 | Kuo et al. | |
| 2014/0001559 A1 | 1/2014 | Lin et al. | |
| 2014/0024192 A1 | 1/2014 | Kim et al. | |
| 2014/0070328 A1 | 3/2014 | Goto | H01L 21/823431 257/401 |
| 2014/0239354 A1* | 8/2014 | Huang | H01L 29/66545 257/288 |

FOREIGN PATENT DOCUMENTS

| | | |
|---|---|---|
| KR | 10-2005-0011952 A | 1/2005 |
| KR | 10-2013-008862 72 A | 8/2013 |
| KR | 10-2013-01209 73 A | 11/2013 |
| WO | WO2006/006438 A1 | 1/2006 |
| WO | WO 2008/155208 A1 | 12/2008 |
| WO | WO 2010/005526 A1 | 1/2010 |

\* cited by examiner

1100

1200

1300

METHODS OF MANUFACTURING SEMICONDUCTOR DEVICES BY FORMING SOURCE/DRAIN REGIONS BEFORE GATE ELECTRODE SEPARATION

CROSS-REFERENCE TO RELATED APPLICATION

This application is a Divisional of U.S. patent application Ser. No. 14/803,893 filed on Jul. 20, 2015 in the United States Patent and Trademark Office which claims priority to Korean Patent Application No. 10-2014-0149483 filed on Oct. 30, 2014 in the Korean Intellectual Property Office which claims priority to U.S. provisional application No. 62/026,948 filed on Jul. 21, 2014 in the United States Patent and Trademark Office, and all the benefits accruing therefrom under 35 U.S.C. 119, the contents of which are herein incorporated by reference in their entirety.

BACKGROUND

1. Field of the Invention

The present inventive concept relates to semiconductor devices and methods of manufacturing the same and/or particularly methods of manufacturing semiconductor devices with multi-gate transistor structures.

2. Description of the Related Art

Techniques for increasing the density of semiconductor devices include forming multi-gate transistor structures including a silicon body of a nanowire shape or a fin shape, and a gate surrounding the silicon body. Such a structure may be scaled relatively easily, as the multi-gate transistor structure uses a three-dimensional channel. Current control capability of such a device can be improved without increasing a length of the gate. In addition, short channel effect (SCE), which involves a potential of the channel region being affected by the drain voltage, can be effectively suppressed.

SUMMARY

Some embodiments of the present inventive concept provide methods of manufacturing semiconductor devices that can improve performance by reducing failures of sidewalls of a gate, a source or a drain.

Some embodiments of the inventive concept provide methods of manufacturing semiconductor devices including forming spaced apart first and second fins on a substrate, forming an isolation layer on the substrate between the first and second fins, forming a gate electrode on the isolation layer and crossing the first and second fins, forming source/drain regions on the first and second fins on first and second sides of the gate electrode, and removing a portion of the gate electrode between the first and second fins to expose the isolation layer after forming of the source/drain regions. The source/drain regions may be formed, for example, by epitaxial growth.

In some embodiments, forming the gate electrode may include forming a gate insulation layer on the first and second fins, forming a gate electrode layer on the gate insulation layer, and forming a hard mask layer on the gate electrode layer. Forming the gate electrode may further include patterning the hard mask layer to form a hard mask pattern and patterning the gate insulation layer and the gate electrode layer using the hard mask pattern as a mask.

In some embodiments, forming the source/drain regions on the first and second fins may be followed by removing the gate electrode and forming a gate structure including a first metal layer and a second metal layer.

In further embodiments, the methods may include forming spacers on lateral surfaces of the gate electrode and on lateral surfaces of the first and second fins. Forming source/drain regions on the first and second fins adjacent the gate electrode may be preceded by removing portions of the first and second fins to recess upper surfaces of the first and second fins below the spacers and forming source/drain regions on the first and second fins on first and second sides of the gate electrode may include forming the source/drain regions on the recessed upper surfaces of the first and second fins.

In some embodiments, removing portions of the first and second fins to recess upper surfaces of the first and second fins below the spacers may include forming an interlayer insulation layer covering the second fin and exposing a portion of the first fin, removing a portion of the exposed first fin to recess the upper surface of the first fin, forming a second interlayer insulation layer covering the first fin and exposing a portion of the second fin, and removing a portion of the exposed second fin to recess the upper surface of the second fin.

Some embodiments, the first fin may be part of a PMOS transistor and the second fin may be part of an NMOS transistor. The source/drain regions include a SiGe source/drain region on the first fin and a Si or SiC source/drain region on the second fin.

Further embodiments of the inventive concept provide methods including forming spaced apart first and second fins on a substrate, forming an isolation layer on the substrate between the first and second fins, forming a dummy gate on the isolation layer and crossing the first and second fins, forming source/drain regions on the first and second fins on first and second sides of the dummy gate, removing the dummy gate to form a trench, forming a gate structure in the trench, and removing a portion of the gate structure between the first and second fins to form respective first and second gate structures on respective ones of the first and second fins. The gate structure may include a gate insulation layer, a first metal layer and a second metal layer, and the gate structure may be formed after formation of the source drain regions.

Still further embodiments provide methods including forming a fin on a substrate and extending longitudinally along a first direction, forming a conductive region extending longitudinally along a second direction transverse to the first direction and crossing the fin, forming first and second source/drain regions on the fin at locations on respective first and second sides of the conductive region, and removing a portion of the conductive region adjacent the fin after forming the first and second source/drain regions to form a gate electrode of a transistor including the first and second source/drain regions and a channel in the fin.

In some embodiments, forming a conductive region extending longitudinally along a second direction transverse to the first direction and crossing the fin may include forming a dummy region extending longitudinally along the second direction transverse to the first direction and crossing the fin prior to forming the first and second source/drain regions, removing the dummy region after forming the first and second source/drain regions to form a trench, and forming the conductive region in the trench.

In some embodiments, forming first and second source/drain regions on the fin at locations on respective first and second sides of the conductive region may be preceded by forming spacers on sidewalls of the fin and removing first and second portions of the fin to recess first and second surfaces of the fin below the spacers. Forming first and second source/drain regions on the fin at locations on respective first and second sides of the conductive region may include forming the first and second source/drain regions on the recessed first and second surfaces. The first and second source/drain regions may be formed by epitaxial growth.

BRIEF DESCRIPTION OF THE DRAWINGS

The above and other features and advantages of the present inventive concept will become more apparent by describing in detail example embodiments thereof with reference to the attached drawings in which.

DETAILED DESCRIPTION

Figure 1:
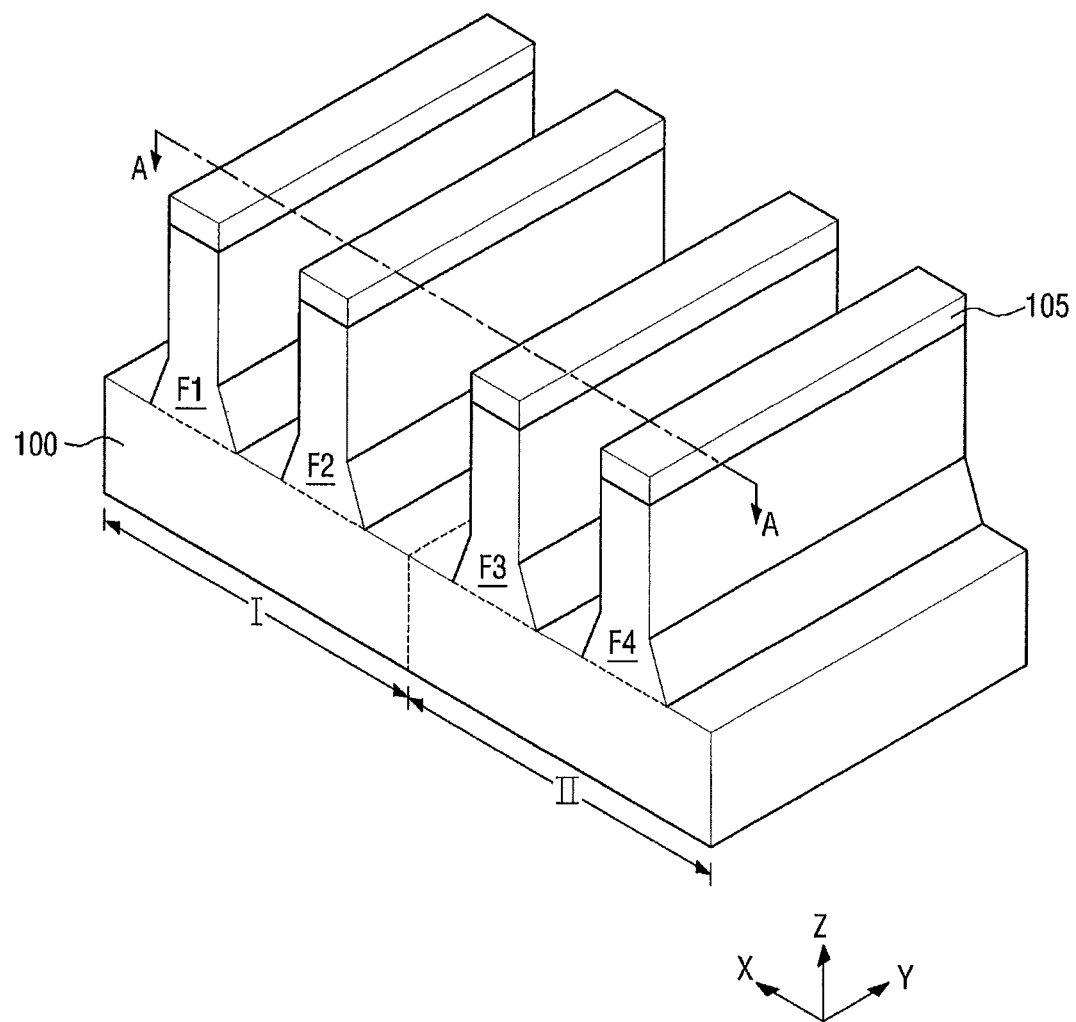
FIGS. 1 to 16 are diagrams illustrating intermediate process steps for manufacturing a semiconductor device according to first embodiments of the present inventive concept.

Advantages and features of the present inventive concept and methods of accomplishing the same may be understood more readily by reference to the following detailed description of example embodiments and the accompanying drawings. The present inventive concept may, however, be embodied in many different forms and should not be construed as being limited to the embodiments set forth herein. Rather, these example embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular example embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, these example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, operations for manufacturing semiconductor devices according to some example embodiments of the present inventive concept will be described with reference to FIGS. 1 to 40. FIGS. 1 to 16 are diagrams illustrating intermediate process steps for manufacturing a semiconductor device according to first embodiments of the present inventive concept.

Figure 2:
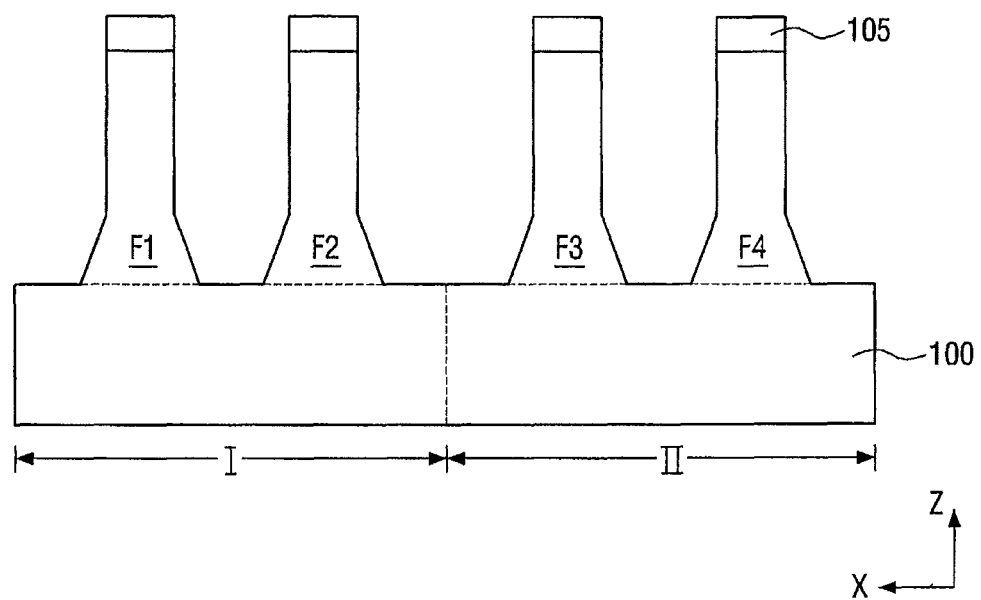

Specifically, FIG. 1 illustrates forming fins using a mask pattern, and FIG. 2 illustrates a cross-sectional view taken along the line A-A of FIG. 1. Referring to FIGS. 1 and 2, fins F1 to F4 are formed on a substrate 100. The substrate 100 may include a first region I and a second region II. The substrate 100 may include, for example, bulk silicon or silicon-on-insulator (SOI). In some embodiments, the substrate 100 may be a silicon substrate, or a substrate made of other materials, such as germanium, silicon germanium, indium antimonide, lead telluride compound, indium arsenide, indium phosphide, gallium arsenide, and/or gallium antimonide. In some embodiments, the substrate 100 may include a base substrate and an epitaxial layer formed on the base substrate.

The fins F1 to F4 may extend lengthwise along a second direction Y on the substrate 100. The fins F1 to F4 may be portions of the substrate 100 or may include an epitaxial layer grown from the substrate 100. For example, the first region I may include a first fin F1 and a second fin F2 extending along the second direction Y and the second region II may include a third fin F3 and a fourth fin F4 extending along the second direction Y.

The fins F1 to F4 may be formed using a mask pattern 105 formed on the substrate 100. The mask pattern 105 may include, for example, silicon oxide, silicon nitride, silicon oxynitride, a metal layer, a photo resist, spin on glass (SOG), and/or a spin on hard mask (SOH). The mask pattern 105 may be formed using, for example, a physical vapor deposition process (PVD), a chemical vapor deposition process (CVD), an atomic layer deposition (ALD) and/or spin coating.

The fins F1 to F4 may be formed by an etching process using the mask pattern 105. Respective bottom portions of the fins F1 to F4 may be wider than respective top portions thereof. In other words, the fins F1 to F4 may have widths increasing downwardly. It will be appreciated that embodiments of inventive concept are not limited thereto.

Figure 3:
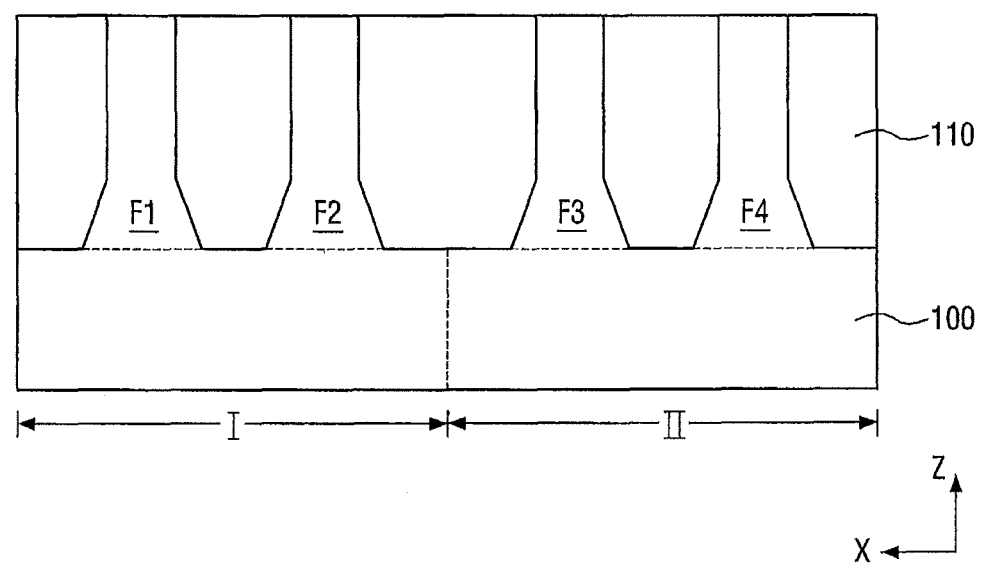

Referring to FIG. 3, an isolation layer 110 is formed between respective ones of the fins F1 to F4. The isolation layer 110 is formed in the substrate 100 to define an active region (not shown) of the semiconductor device. The isolation layer 110 may include a shallow trench isolation (STI) or a deep trench isolation (DTI) structure, which may be advantageous for high integration owing to isolation characteristics and a small area occupied. It will be appreciated however, that embodiments of the present inventive concept are not limited thereto. The isolation layer 110 may include, for example, silicon oxide, silicon nitride, silicon oxynitride, or combinations thereof.

The isolation layer 110 is formed on the substrate 100, and a planarization process (e.g., CMP) is performed to planarize a top surface of the isolation layer 110 and top surfaces of the fins F1 to F4. Accordingly, the top surface of the isolation layer 110 and the top surfaces of the fins F1 to F4 may be coplanar.

Figure 4:
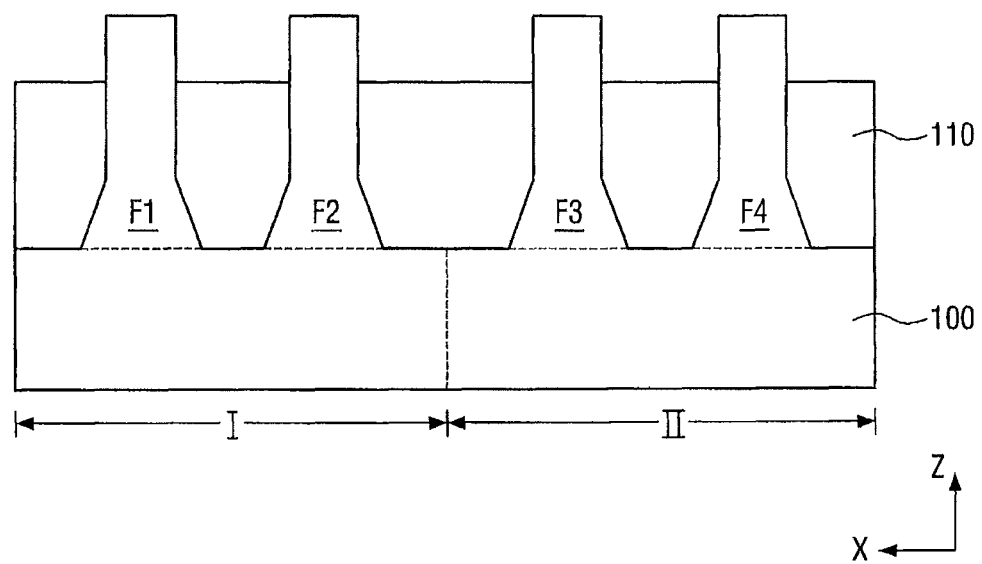

Referring to FIG. 4, a top portion of the isolation layer 110 is etched using an etching process. The isolation layer 110 may be etched to a first depth. In the etching process of the isolation layer 110, materials having different etching selectivity levels may be used. Therefore, only the top portion of the isolation layer 110, except for the fins F1 to F4 and the substrate 100, may be etched. The etching process may include, for example, a dry etching process and a wet etching process, but embodiments of the present inventive concept are not limited thereto.

Figure 5:
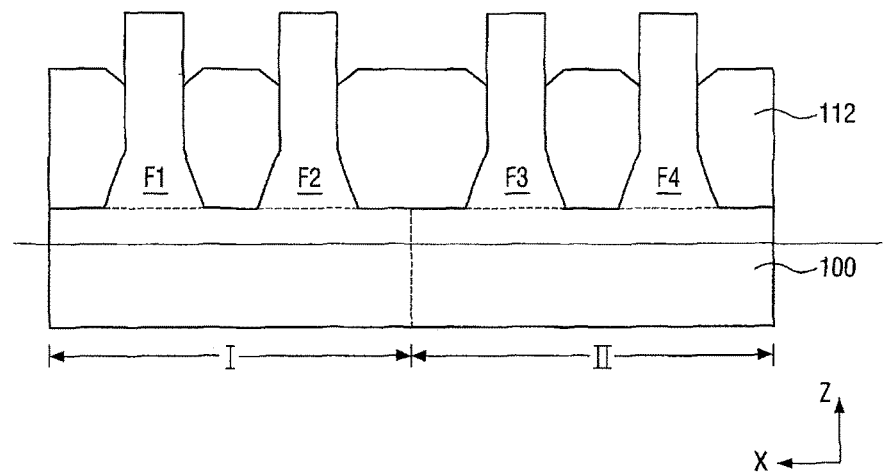
Figure 5:
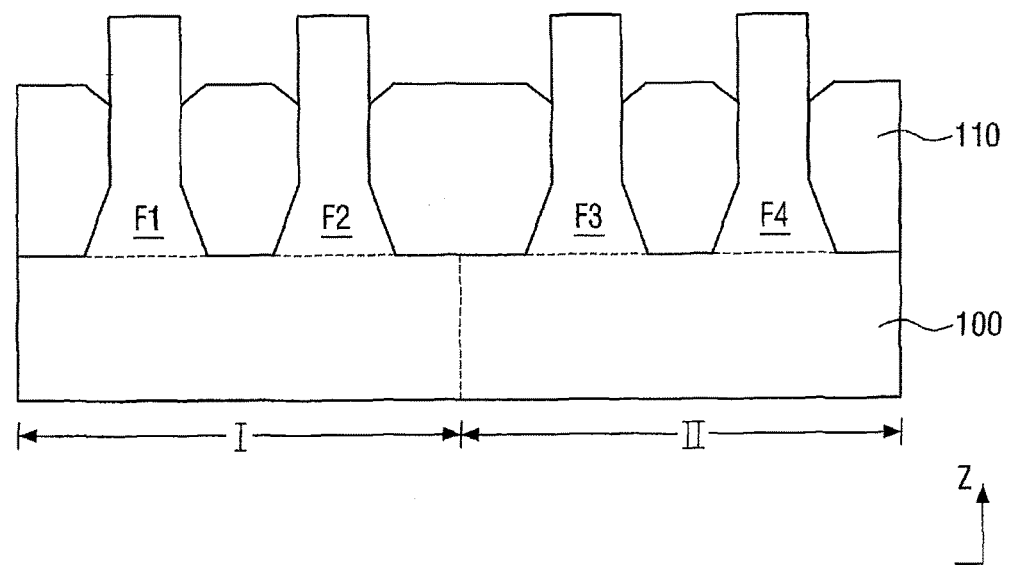

Referring to FIG. 5, the isolation layer 110 resulting after the etching process may have a concave or convex upper surface, rather than a planar upper surface. For example, more etching may occur to side portions of the isolation layer 110 near the fins F1 to F4 than to center portions of the isolation layer 110 between the fins F1 to F4. Therefore, the isolation layer 110 may have a convex upper surface, but aspects of the present inventive concept are not limited thereto. In some embodiments, the isolation layer 110 may be etched to have a concave upper surface.

Figure 6:
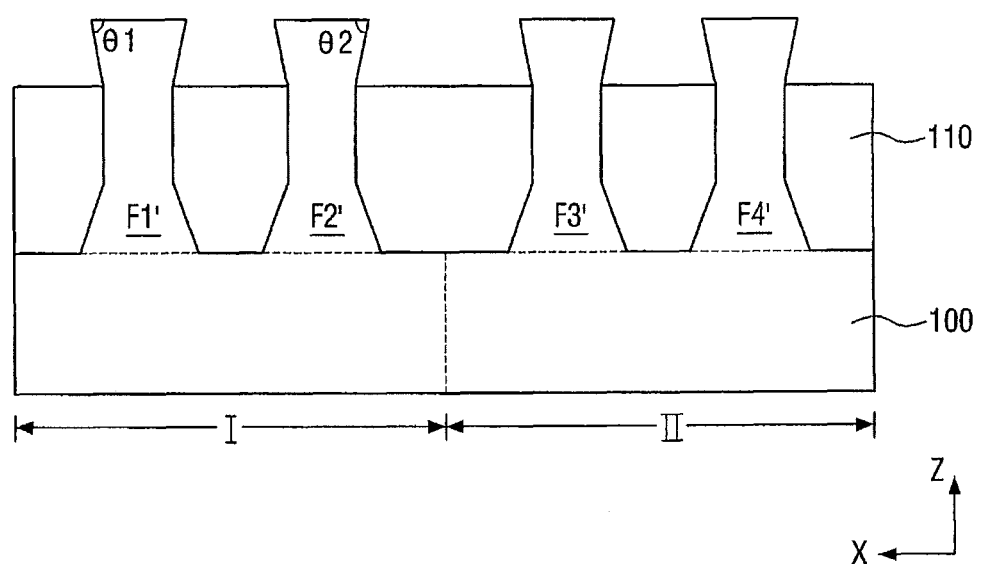

Referring to FIG. 6, in some embodiments, after the etching process, top surfaces and lateral surfaces of fins F1' to F4' may form acute angles. In detail, even if materials having different etching selectivity levels are used in the etching process of the isolation layer 110, portions of the isolation layer 110 and the fins F1' to F4' may also be etched. Greater etching may occur at mid portions of the fins F1 to F4 than near top portions of the fins F1 to F4. Therefore, the top surfaces and lateral surfaces of the fins F1' to F4' may have a first angle $\theta 1$ or a second angle $\theta 2$, which is smaller than 90 degrees. The magnitude of the first angle $\theta 1$ or the second angle $\theta 2$ may vary according to the kind of etching gas used in the etching process. With the structures of the fins F1' to F4', etching of a spacer 130 or a gate electrode 125 formed on lateral surfaces of the fins F1' to F4' (see FIG. 10) can be easily achieved, but aspects of the present inventive concept are not limited thereto.

Figure 7:
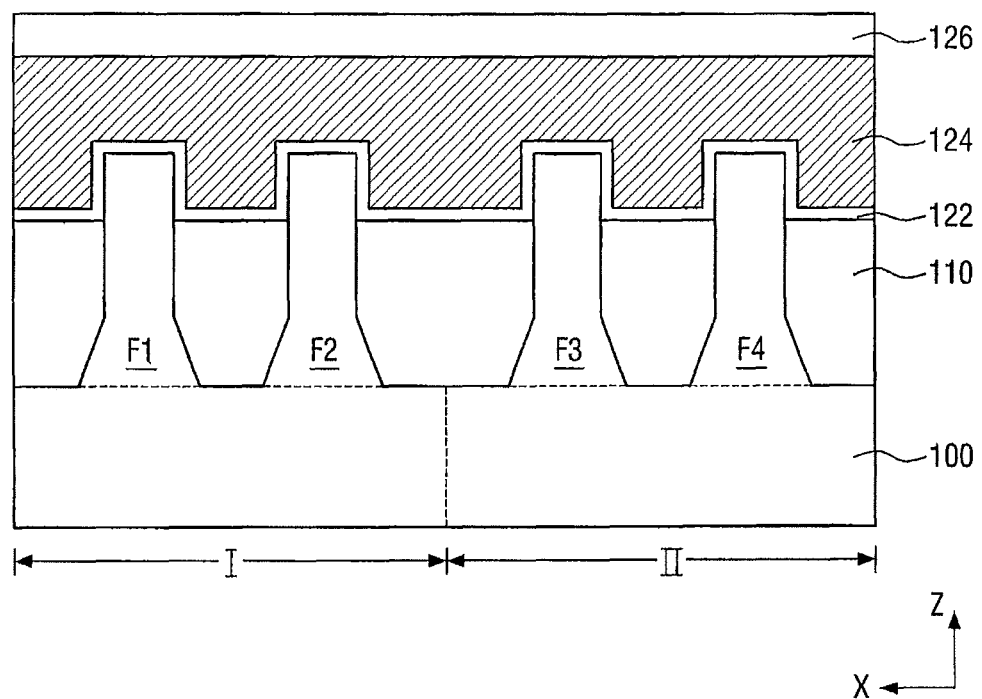

Referring to FIG. 7, a gate insulation layer 122, a gate electrode layer 124 and a hard mask layer 126 are sequentially formed on the fins F1 to F4 and the isolation layer 110. The gate insulation layer 122 may conform to the fins F1 to F4 and the isolation layer 110. The gate insulation layer 122 may be formed between each of the fins F1 to F4 and the gate electrode layer 124. The gate insulation layer 122 may be formed between the isolation layer 110 and the gate electrode layer 124. The gate insulation layer 122 may include a high-k material, such as $HfO_2$, $ZrO_2$, or $TaO_2$.

A gate electrode layer 124 may be formed on the gate insulation layer 122. The gate electrode layer 124 may include a conductive material. In some example embodiments of the present inventive concept, the gate electrode layer 124 may include a highly conductive metal, but aspects of the present inventive concept are not limited thereto. In some embodiments, for example, the gate electrode layer 124 may include a conductive non-metal, such as polysilicon.

A hard mask layer 126 may be formed on the gate electrode layer 124. The hard mask layer 126 may include, for example, silicon oxide, silicon nitride, silicon oxynitride, a metal layer, a photo resist, spin on glass (SOG), and/or a spin on hard mask (SOH). The hard mask layer 126 may be formed using, for example, a physical vapor deposition process (PVD), a chemical vapor deposition process (CVD), an atomic layer deposition (ALD) and/or spin coating. It will be appreciated that embodiments of the present inventive concept are not limited thereto.

Figure 8:
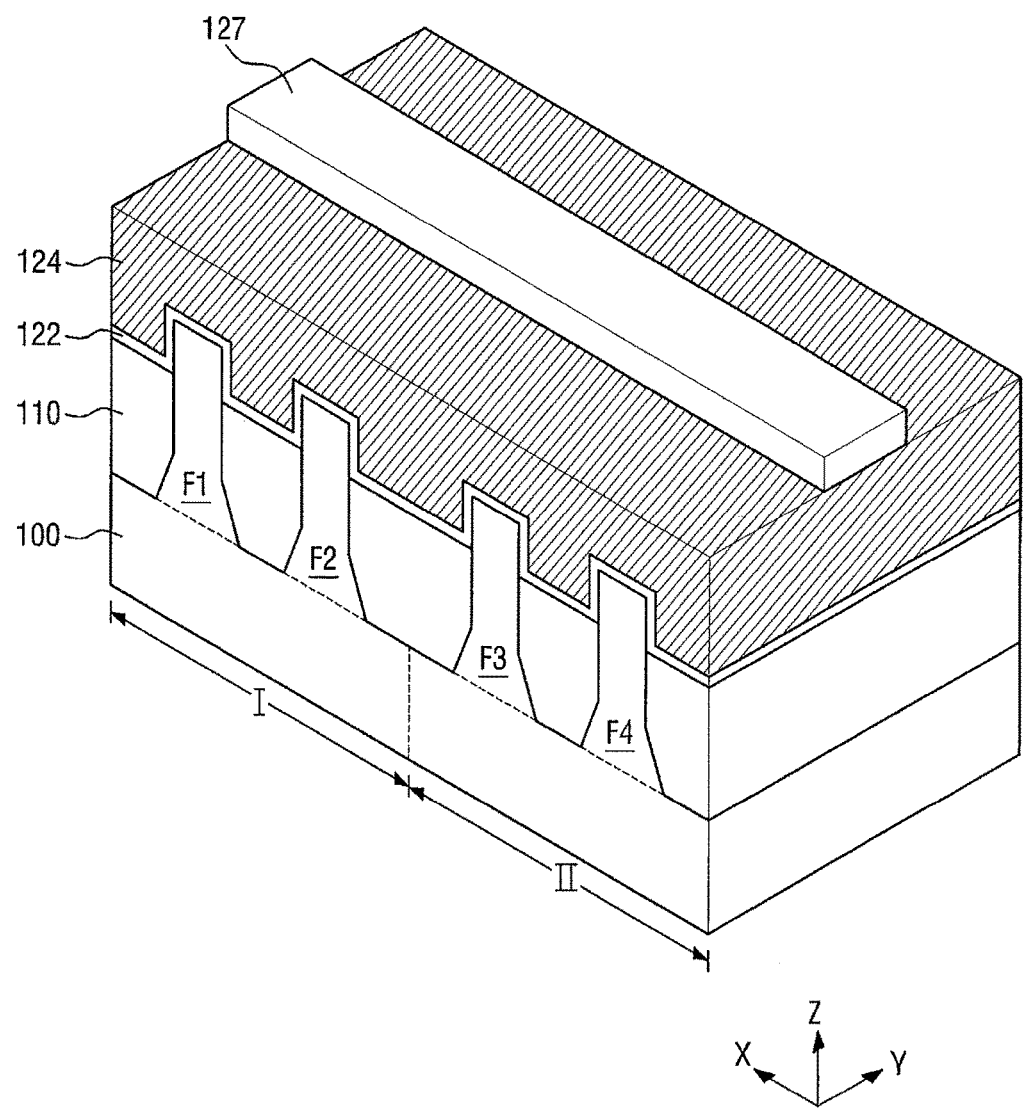

Referring to FIG. 8, a hard mask pattern 127 may be formed from the hard mask layer 126 using an etching process. The hard mask pattern 127 may extend across the fins F1 to F4 along a first direction X.

Figure 9:
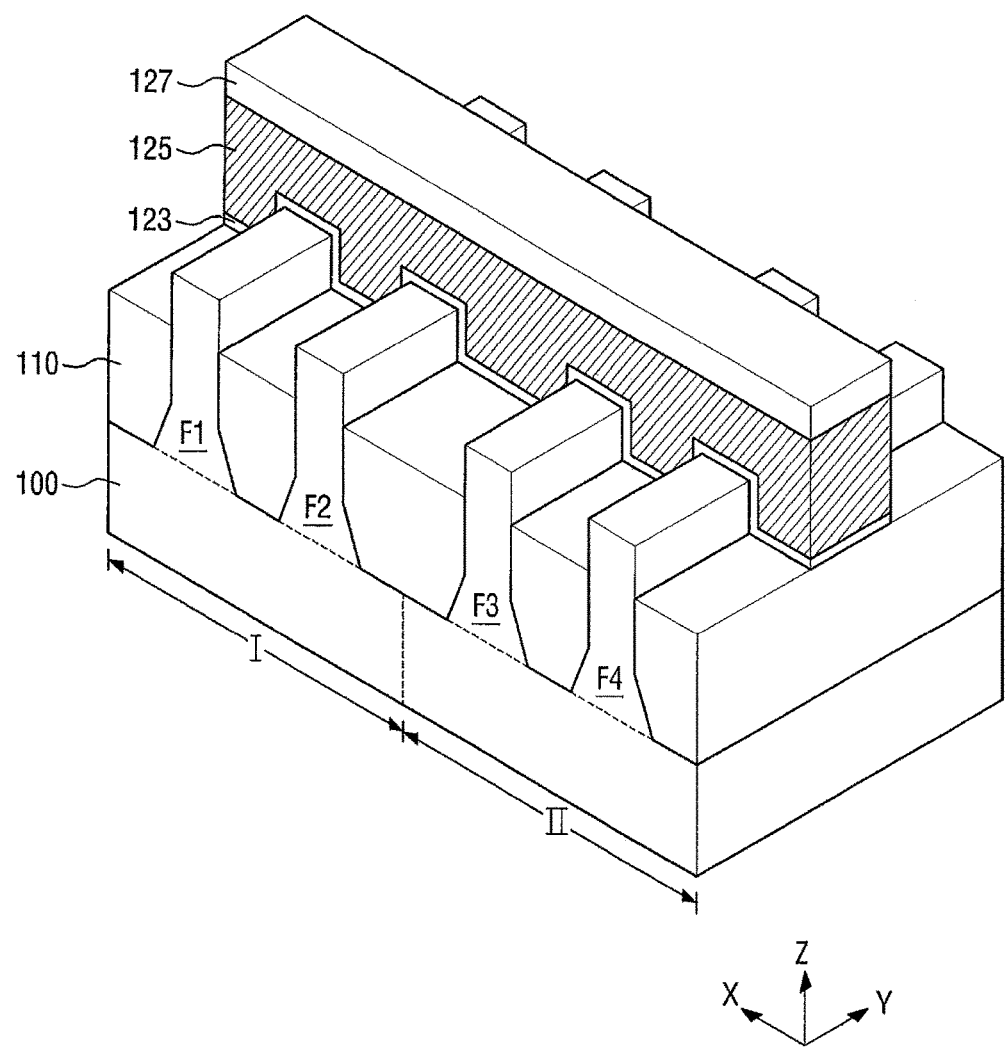

Referring to FIG. 9, a gate insulation layer 123 and a gate electrode 125 may be formed using the hard mask pattern 127 as an etch mask. Accordingly, the gate insulation layer 123 and the gate electrode 125 may extend along the first direction X, crossing the fins F1 to F4. As shown, the second direction Y may be orthogonal to the first direction X, but embodiments of the present inventive concept are not limited thereto.

Figure 10:
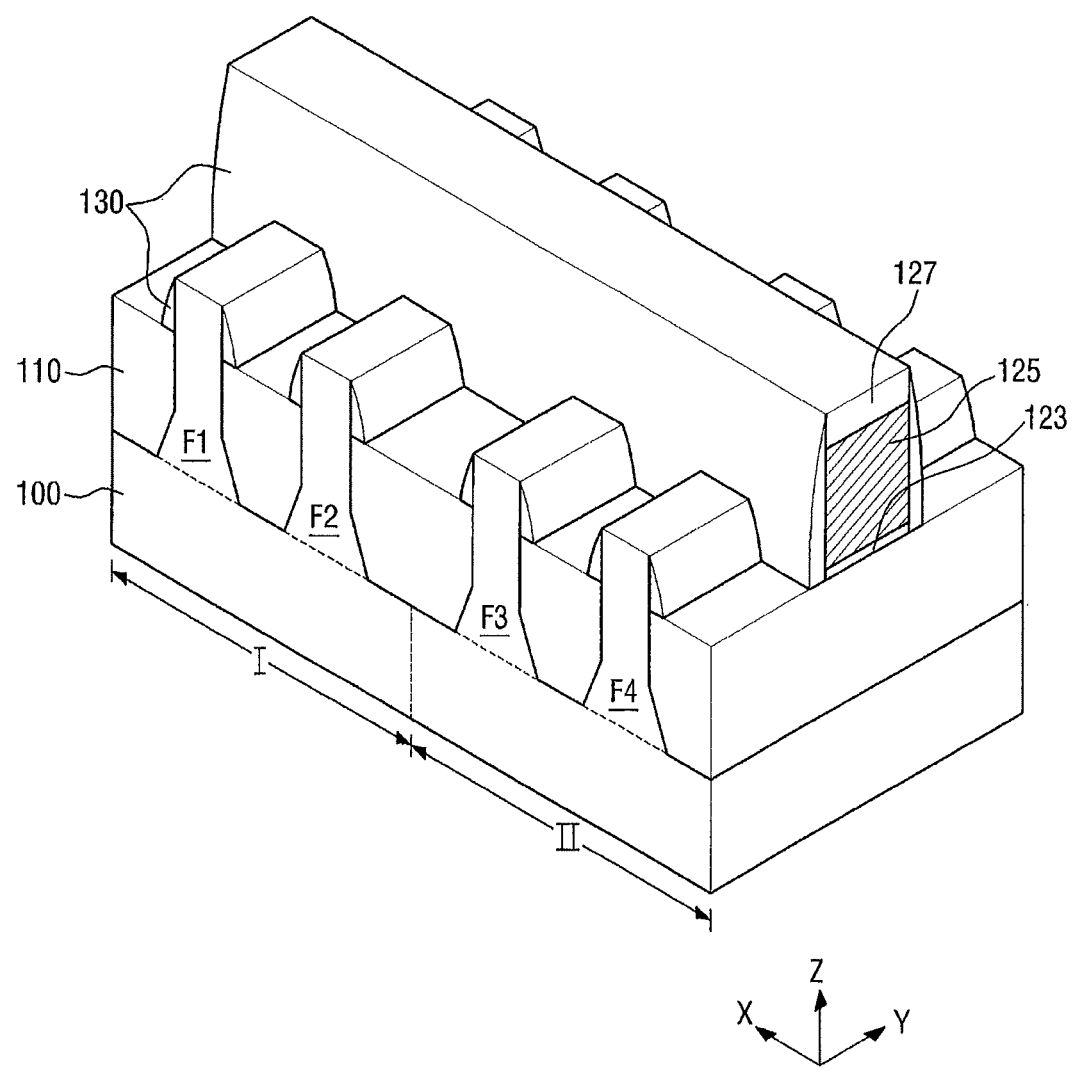

Referring to FIG. 10, the spacer 130 is formed on sidewalls of the gate electrode 125 and sidewalls of top portions of the fins F1 to F4.

For example, an insulation layer is formed on the resultant product having the gate electrode 125, and an etch back process is performed to form spacers 130. The spacers 130 may expose a top surface of the hard mask pattern 127 and top surfaces of the fins F1 to F4. The spacers 130 may include silicon nitride and/or silicon oxynitride.

The spacers 130 may be positioned on at least one side of the gate electrode 125. In detail, as shown in FIG. 10, the spacers 130 may be positioned on opposite sides of the gate electrode 125. In FIG. 10, one lateral surface of the spacers 130 is curved, but embodiments of the present inventive concept are not limited thereto. Shapes of the spacers 130 may vary. For example, in some example embodiments of the present inventive concept, the spacers 130 may have an I-shaped or an L-shaped cross-section, unlike in FIG. 10.

Figure 11:
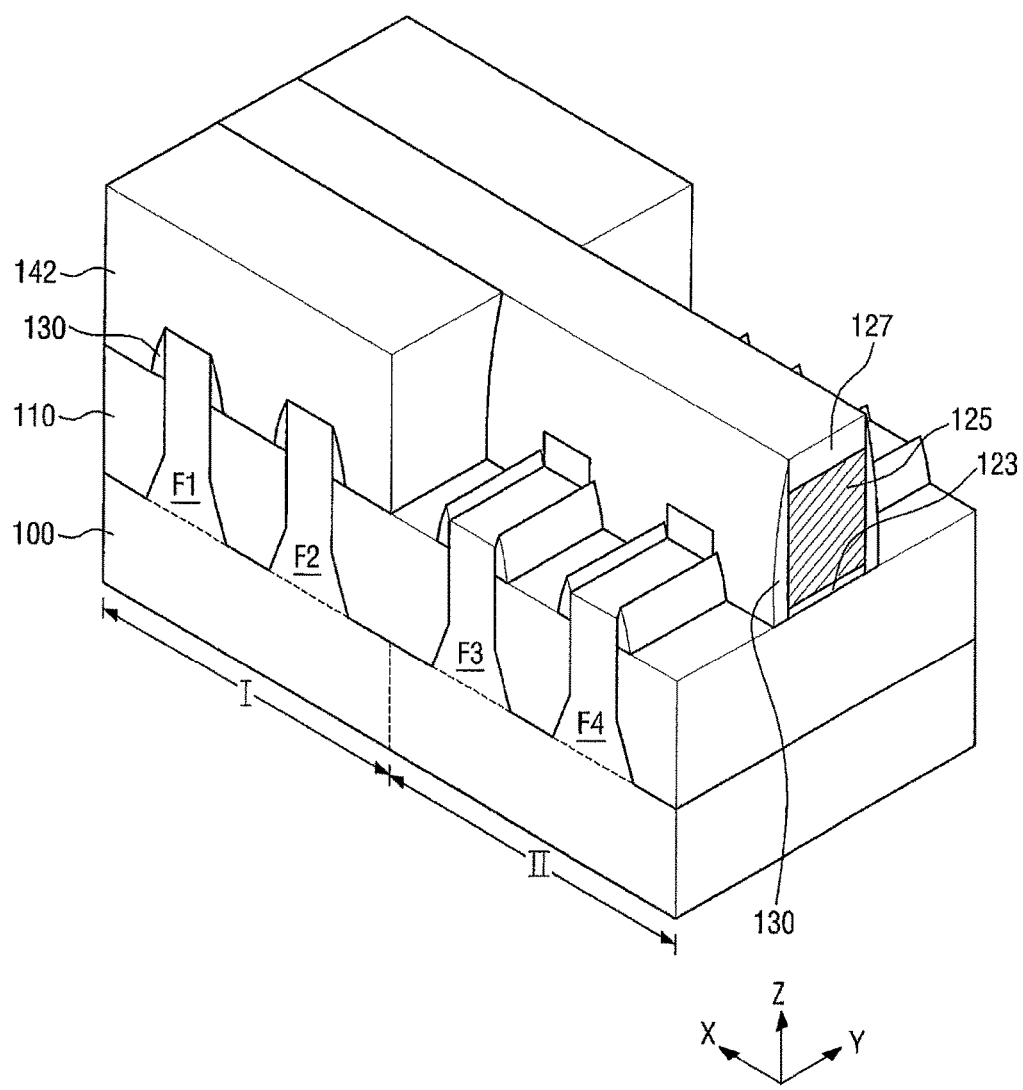
Figure 12:
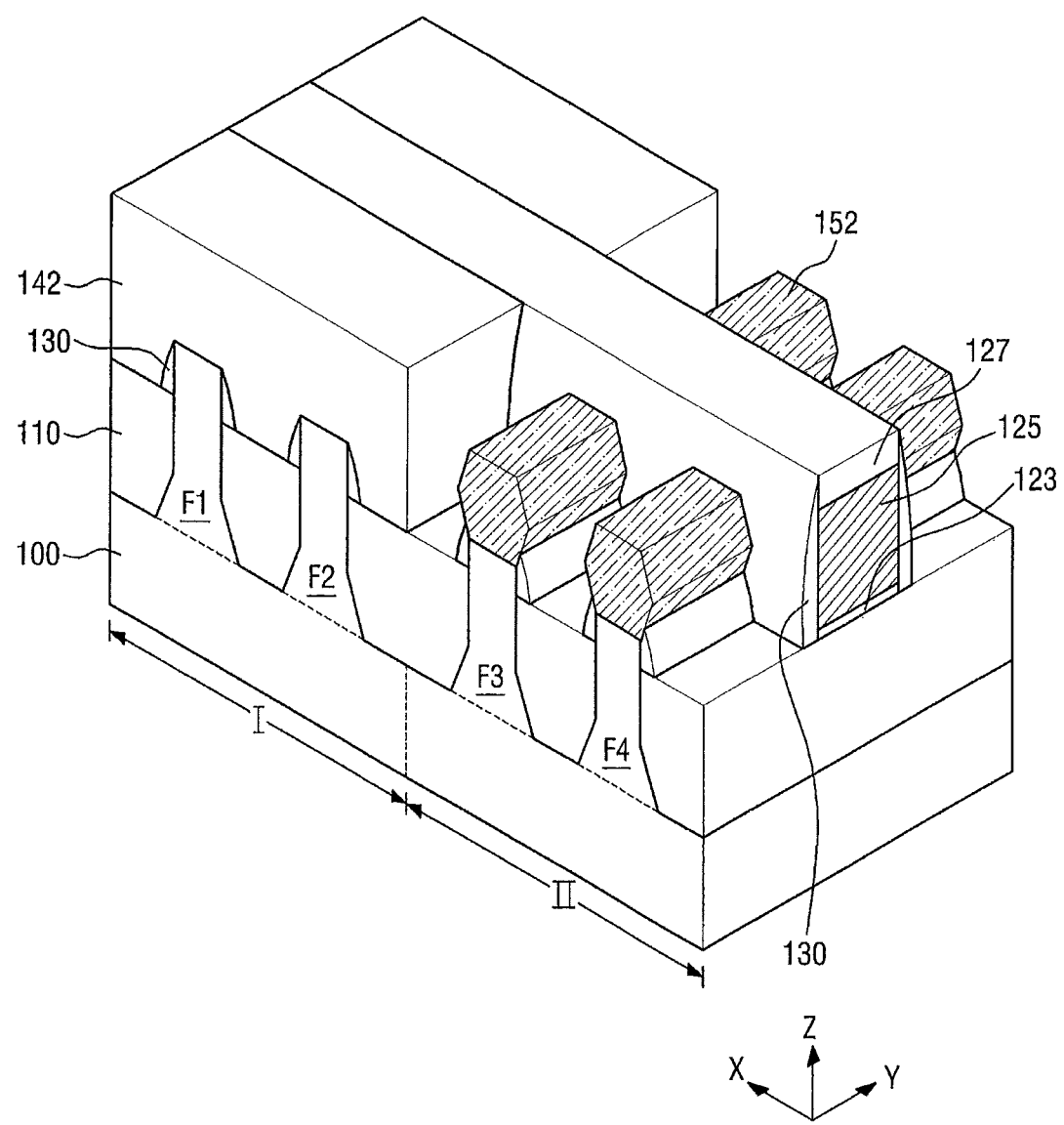

Referring to FIGS. 11 and 12, a first interlayer insulation layer 142 covering only the first region I of the substrate 100 is formed. The first interlayer insulation layer 142 may include a silicon oxide, such as borosilicate glass (BSG), phosphosilicate glass (PSG), borophosphosilicate glass (BPSG), undoped silicate glass (USG), tetraethylorthosilicate (TEOS), and/or high density plasma CVD (HDP-CVD) silicon oxide.

Top portions of the third fin F3 and the fourth fin F4 on the second region II of the substrate 100 are recessed. Accordingly, the third fin F3 and the fourth fin F4 positioned at opposite sides of the gate electrode 125 may have reduced heights. Portions of the spacers 130 may be etched together with the third fin F3 and the fourth fin F4, but aspects of the present inventive concept are not limited thereto.

First source/drain regions 152 may be formed on the top surfaces of the third fin F3 and the fourth fin F4 using, for example, epitaxial growth. The epitaxial growth may include an eSiGe process. To form an epitaxial layer on the substrate 100, solid phase epitaxy (SPE), liquid phase epitaxy (LPE) and/or vapor phase epitaxy (VPE) may be employed. For example, according to first embodiments of the present inventive concept, a single crystalline epitaxial layer may be allowed to grow at a temperature in a range of approximately 500° C. to approximately 800° C. using a source gas including silicon (Si) and/or germanium (Ge). Accordingly, a single crystalline epitaxial layer including silicon germanium (SiGe) is formed on the substrate 100. Thereafter, in order to stabilize the grown single silicon germanium (SiGe) crystalline epitaxial layer, a heat treatment process may be performed. The first source/drain regions 152 may include SiGe. The structure formed in the second region II may function as a PMOS transistor. In addition, spacers 130 may be positioned under the first source/drain regions 152.

Figure 13:
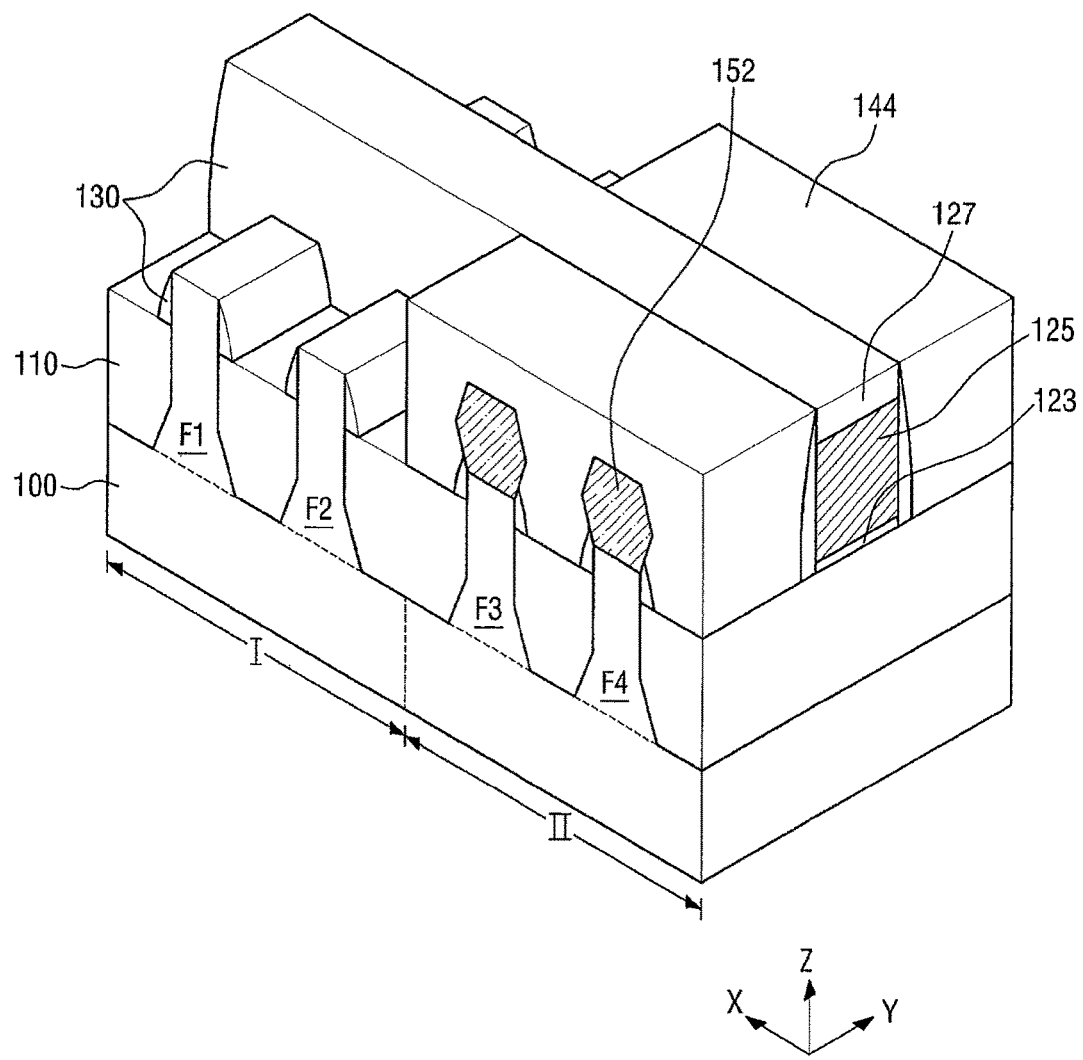
Figure 14:
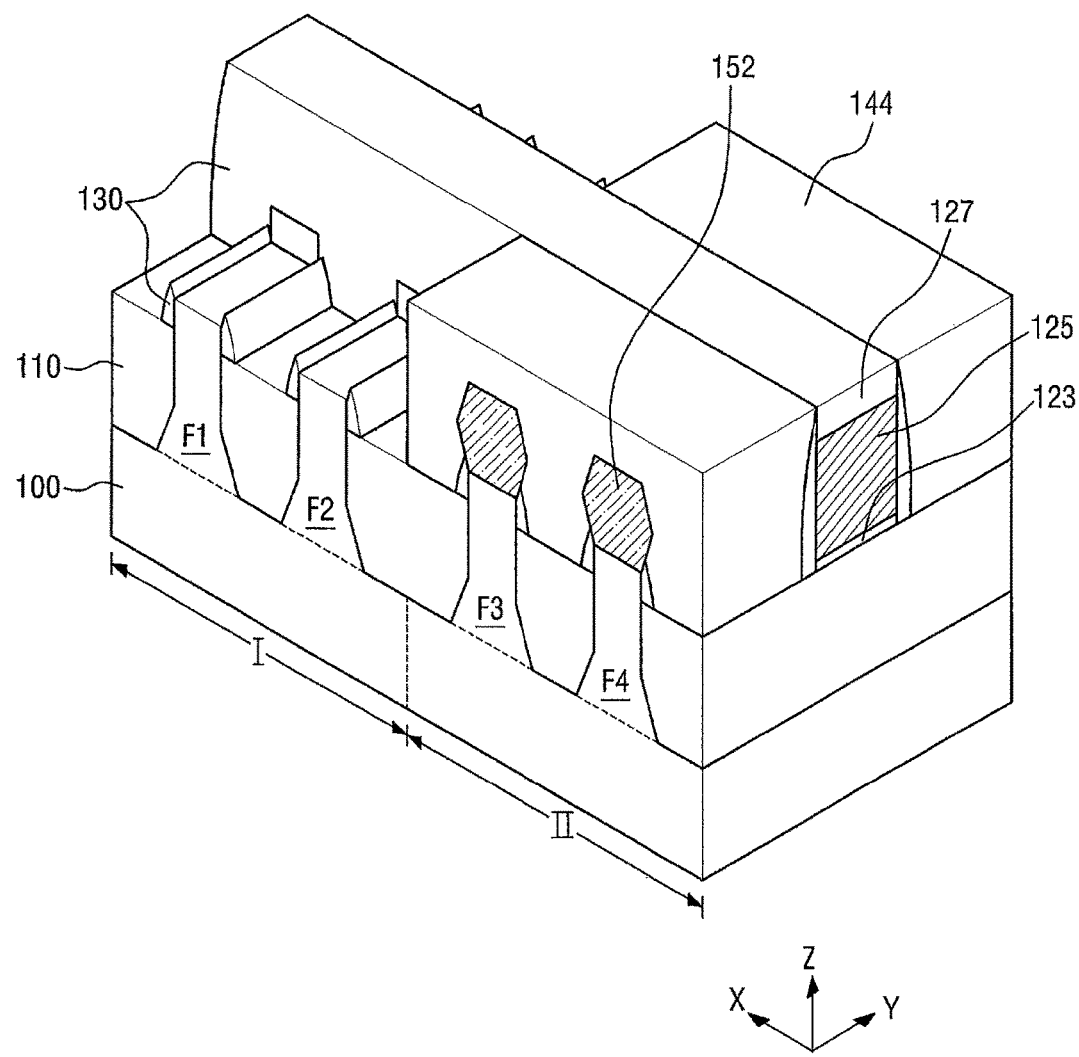
Figure 15:
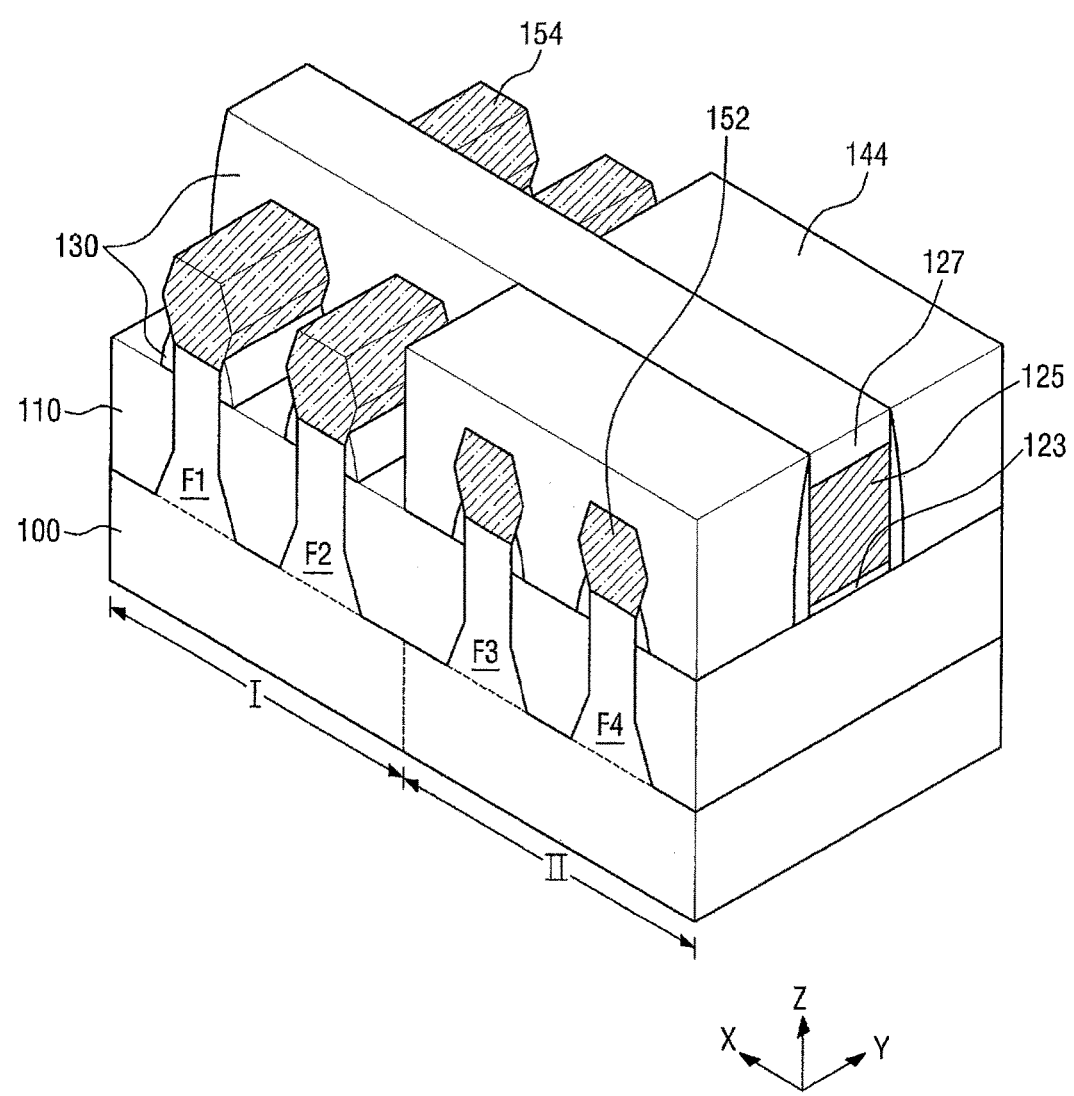

Referring to FIGS. 13 to 15, the first interlayer insulation layer 142 is removed, and a second interlayer insulation layer 144 covering only the second region II is then formed. The second interlayer insulation layer 144 may include a silicon oxide, such as borosilicate glass (BSG), phosphosilicate glass (PSG), borophosphosilicate glass (BPSG), undoped silicate glass (USG), tetraethylorthosilicate (TEOS), or high density plasma CVD (HDP-CVD) silicon oxide.

Top portions of the first fin F1 and the second fin F2 on the first region I of the substrate 100 are recessed, thus reducing the height of the first fin F1 and the second fin F2 positioned at opposite sides of the gate electrode 125. In the recessing, portions of the spacers 130 may be etched together with the first fin F1 and the second fin F2, but embodiments of the present inventive concept are not limited thereto.

Second source/drain regions 154 may be formed on the top surfaces of the first fin F1 and the second fin F2 using epitaxial growth. The epitaxial growth may include an eSiGe process. For example, a single crystalline epitaxial layer may be grown at a temperature in a range of approximately 500° C. to approximately 800° C. using a source gas including silicon (Si) or silicon carbide (SiC). Accordingly, a single crystalline epitaxial layer including silicon (Si) or silicon carbide (SiC) is formed on the substrate 100. Thereafter, in order to stabilize the grown single crystalline epitaxial layer, a heat treatment process may be performed. As the result, the second source/drain regions 154 may include silicon (Si) or silicon carbide (SiC). The structure in the first region I may function as an NMOS transistor. In addition, spacers 130 may be positioned under the second source/drain regions 154.

For a PMOS transistor, the first source/drain regions 152 may include a compressive stress material, such as a material having a greater lattice constant than silicon (Si), for example, SiGe. The compressive stress material may improve the mobility of carriers of the channel region by applying a compressive stress to the third and fourth fins F3 and F4.

For an NMOS transistor, the second source/drain regions 154 may include the same material as the substrate 100 or a tensile stress material. For example, when the substrate 100 includes Si, the second source/drain regions 154 may include Si or a material having a smaller lattice constant than Si (e.g., SiC).

In the above-described embodiments, the PMOS transistor and the NMOS transistor are sequentially formed, but embodiments of the present inventive concept are not limited thereto. For example, a forming sequence of the PMOS transistor and the NMOS transistor may be varied. In addition, positions of the PMOS transistor and the NMOS transistor formed may also be varied.

Figure 16:
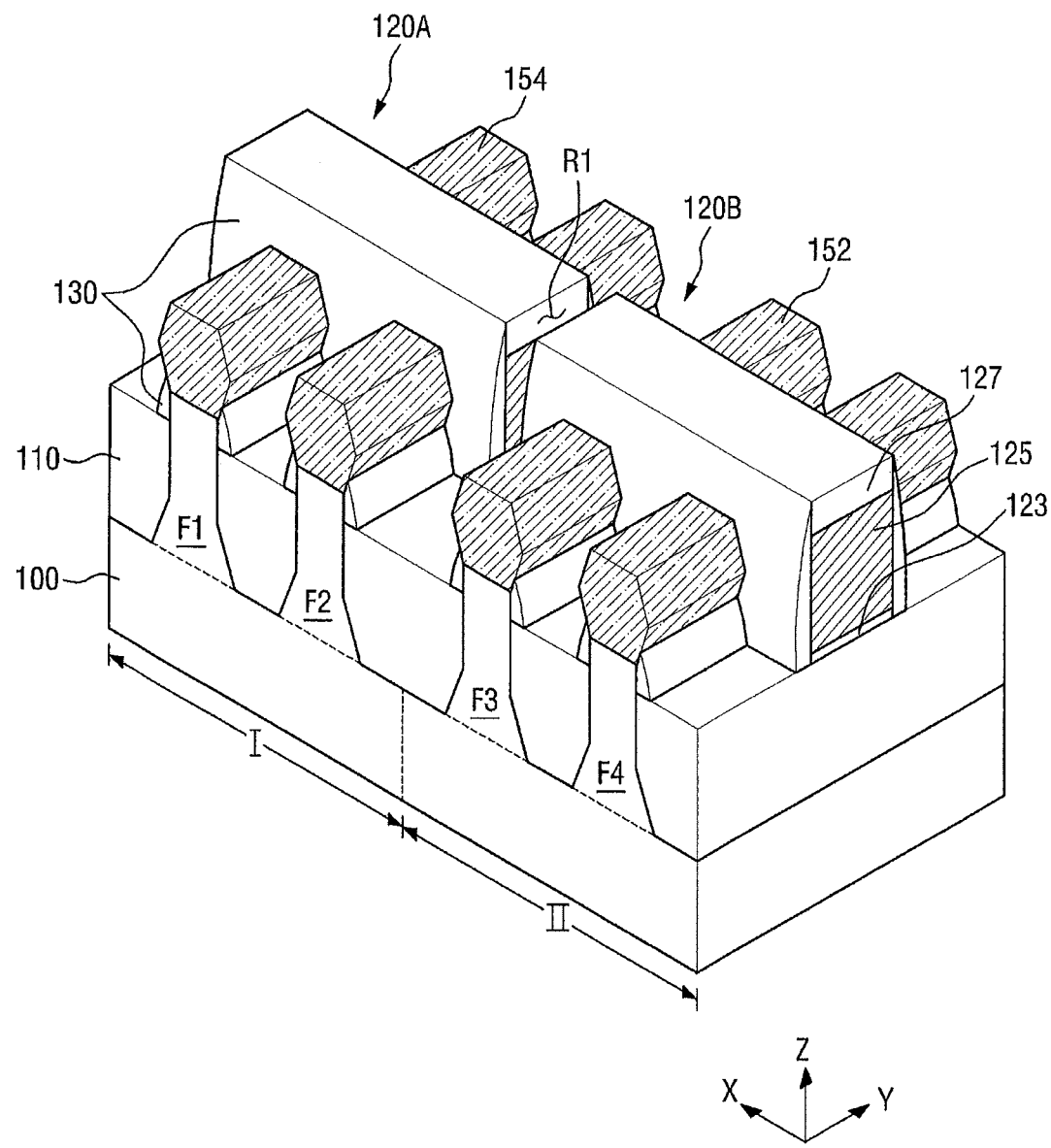

Referring to FIG. 16, after the forming of the first and second source/drain regions 152 and 154, the gate electrode 125 positioned between the second fin F2 and the third fin F3 may be etched to expose the isolation layer 110. In detail, the gate electrode 125 may be etched along the second direction Y to expose the isolation layer 110 corresponding to a boundary between the first region I and the second region II on the substrate 100. The etching process may be an anisotropic etching process, such as a dry etching process.

Etching processes may include dry and wet etching processes. Wet etching may be used to selectively remove a material using a reactive solution. Wet etching may be an isotropic etching process in which a vertical etch rate and a horizontal etch rate are substantially equal.

A dry etching process may use a reactive gas or vapor and, like the wet etching, may be an isotropic etching process. However, a dry etching process that uses a gas or vapor decomposed using plasma may be an anisotropic etching process. Such plasma etching may be anisotropic etching in which the etch rate into the substrate is greater than a lateral etch rate. The etching of the gate electrode 125 may be performed using plasma etching, but embodiments of the present inventive concept are not limited thereto.

During the etching process, the gate electrode 125, the gate insulation layer 123, the hard mask pattern 127 and the spacers 130 may be etched together. In addition, a portion of the isolation layer 110 may also be etched and the portion of the isolation layer 110 may be exposed. Accordingly, a first gate structure 120A may be formed in the first region I, a second gate structure 120B may be formed in the second region II, and a first trench R1 may be formed between the first gate structure 120A and the second gate structure 120B. The first gate structure 120A and the second gate structure 120B may be electrically disconnected from each other, and may be parts of separate transistors.

As described above, when the gate electrode 125 is etched after the forming of the source/drain regions 152 and 154, the semiconductor device may be short-circuited when forming the source/drain regions 152 and 154. If the epitaxial growth process for the source/drain regions 152 and 154 were to be performed after the short-circuiting of the semiconductor device, failures of the semiconductor device might be generated, so that characteristics of the semiconductor device might be changed, as the sidewalls of the gate, source or drain would be exposed during the epitaxial growth process. However, when the semiconductor device is short-circuited after the epitaxial growth process is performed as described above, the likelihood of failure can be reduced, and defects of the sidewalls of the gate can be reduced, thereby improving the performance of the semiconductor device.

FIGS. 17 to 20 are diagrams illustrating intermediate process steps for manufacturing a semiconductor device according to second embodiments of the present inventive concept. Repeated descriptions of previously described items will be omitted, with the following description focusing on differences between the presently described embodiments and previously described embodiments.

Some process steps for manufacturing a semiconductor device according to second embodiments of the present inventive concept are substantially the same as those described above according to the first embodiments of the present inventive concept shown in FIGS. 1 to 15.

Figure 17:
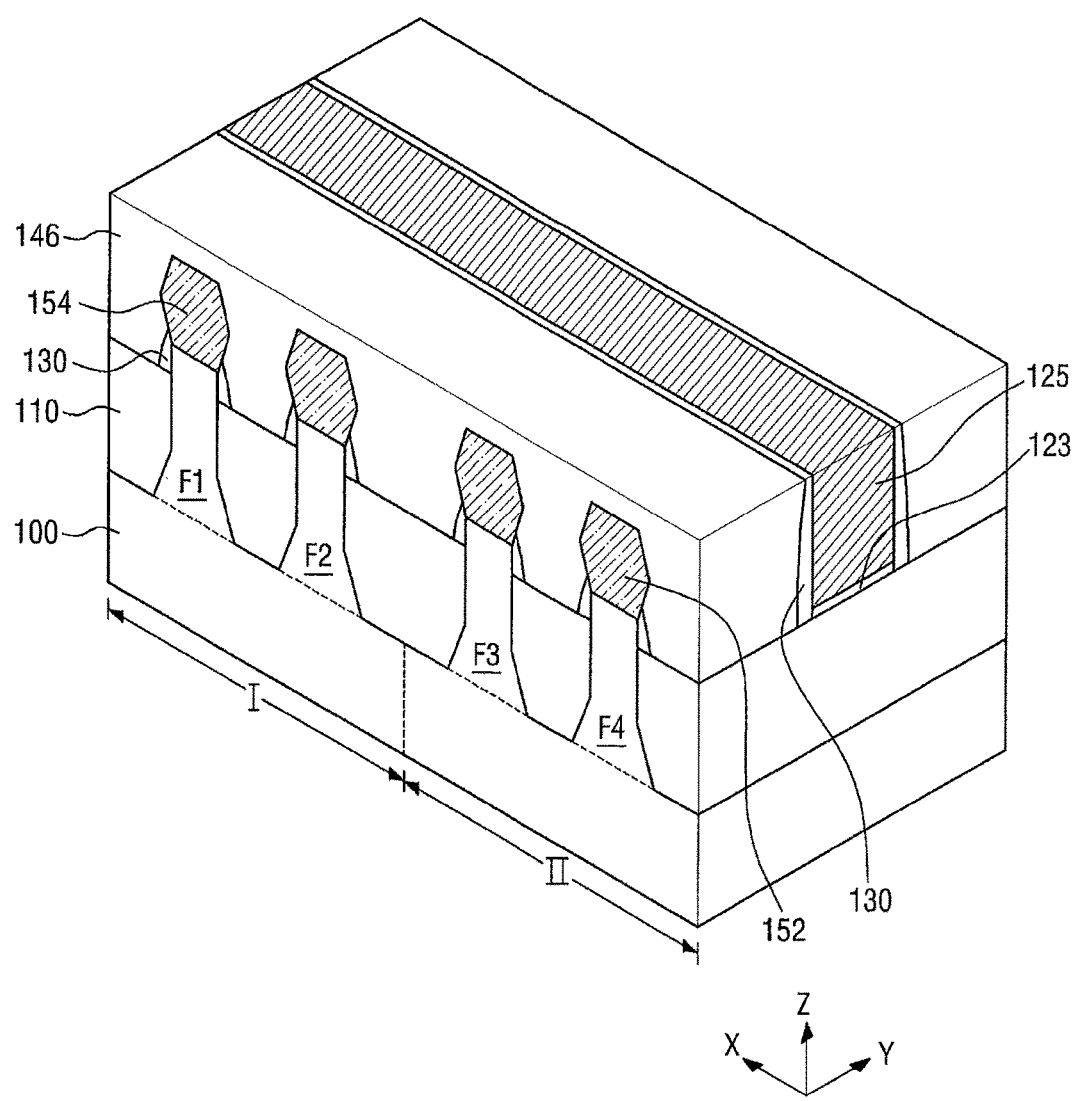
FIGS. 17 to 20 are diagrams illustrating intermediate process steps for manufacturing a semiconductor device according to second embodiments of the present inventive concept.

Referring to FIG. 17, subsequent to the operations described above with reference to FIG. 15, an interlayer insulation layer 146 is formed on the structure having first and second source/drain regions 152 and 154. The interlayer insulation layer 146 may be, for example, a silicon oxide layer. The interlayer insulation layer 146 may be planarized until a top surface of a gate electrode 125 is exposed. As a result of the planarization, a hard mask pattern 127 may be removed. The gate electrode 125 may be used as a dummy gate electrode.

Figure 18:
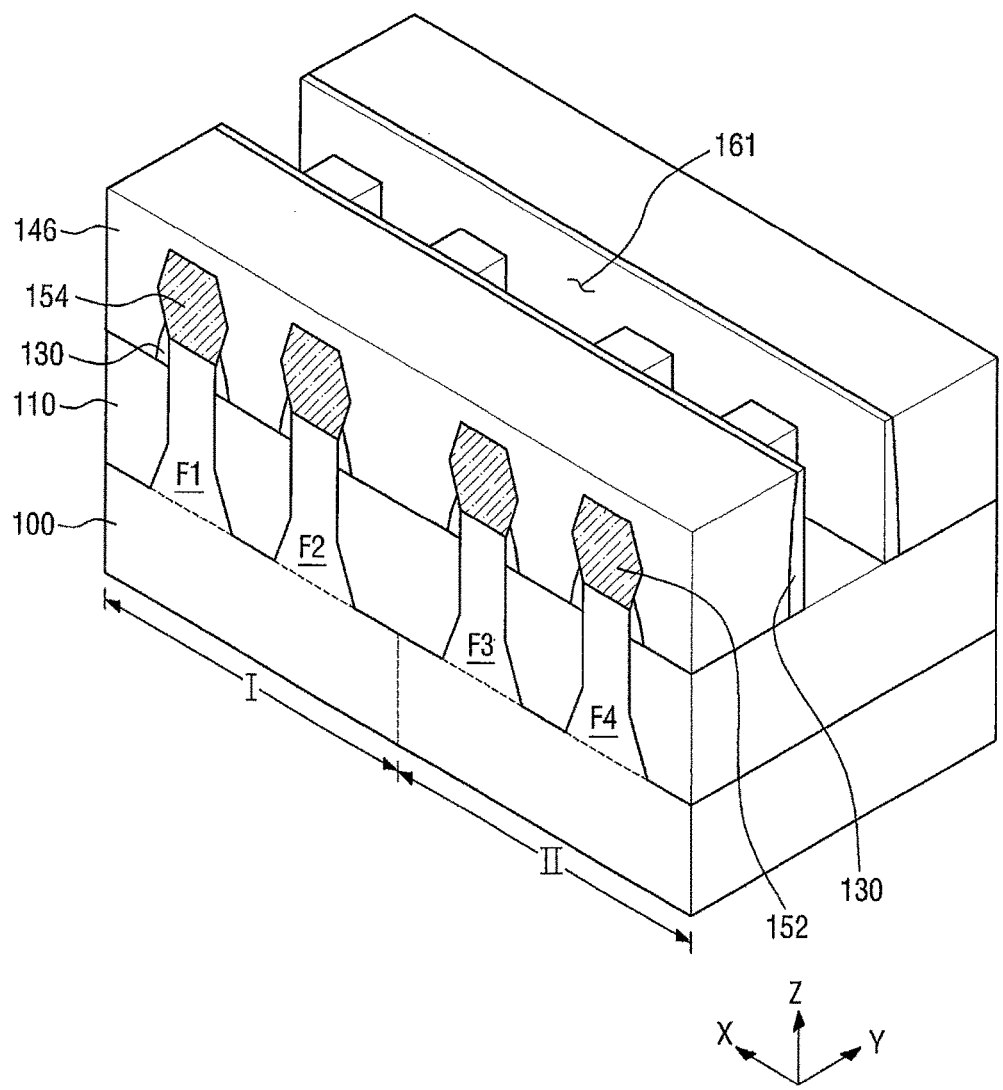

Referring to FIG. 18, the gate insulation layer 123 and the gate electrode 125 are removed, leaving a trench 161 through which the isolation layer 110 and portions of fins F1 to F4 are exposed.

Figure 19:
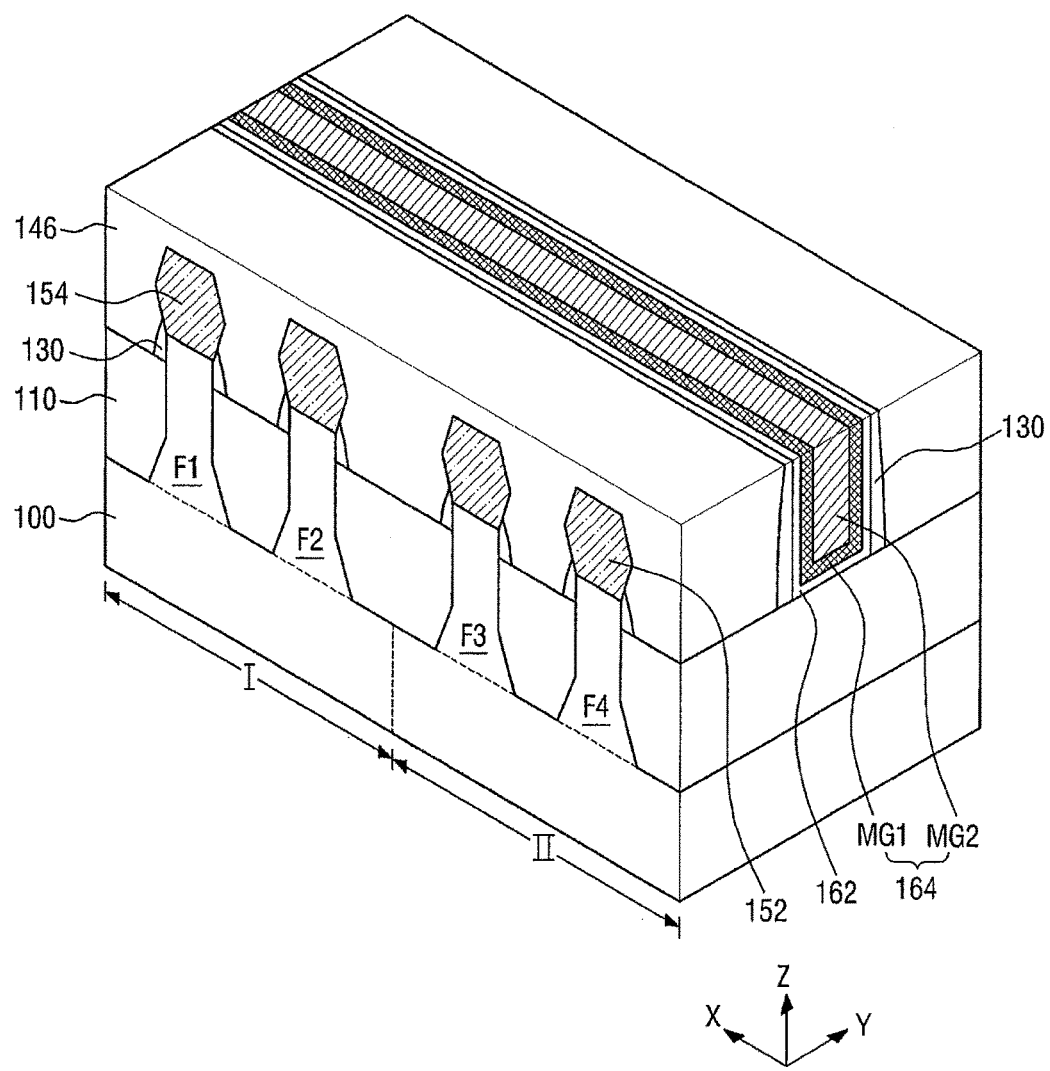

Referring to FIG. 19, a gate insulation layer 162 and a gate electrode 164 are formed in the trench 161. The gate insulation layer 162 may conform to sidewalls and a bottom surface of the trench 161. The gate electrode 164, including metal layers MG1 and MG2, may be formed on the gate insulation layer 162.

The gate insulation layer 162 may be formed between the fins F1 to F4 and the gate electrode 164. The gate insulation layer 162 may be formed on top portions of the fins F1 to F4. In addition, the gate insulation layer 162 may be disposed between the gate electrode 164 and the isolation layer 110. The gate insulation layer 162 may include a high-k material having a dielectric constant greater than silicon oxide. For example, the gate insulation layer 162 may include $HfO_2$, $ZrO_2$, and/or $TaO_2$.

The gate electrode 164 may extend along the first direction X and cross the fins F1 to F4. The gate electrode 164 may include metal layers MG1 and MG2. The first metal layer MG1 may function to adjust a work function, and the second metal layer MG2 may function to fill a space formed by the first metal layer MG1. For example, the first metal layer MG1 may include TiN, TaN, TiC, and/or TaC. The second metal layer MG2 may include W and/or or Al. In some embodiments, the gate electrode 164 may include a non-metal, such as Si or SiGe. The gate electrode 164 may be formed using, for example, a replacement process, but embodiments of the present inventive concept are not limited thereto.

Figure 20:
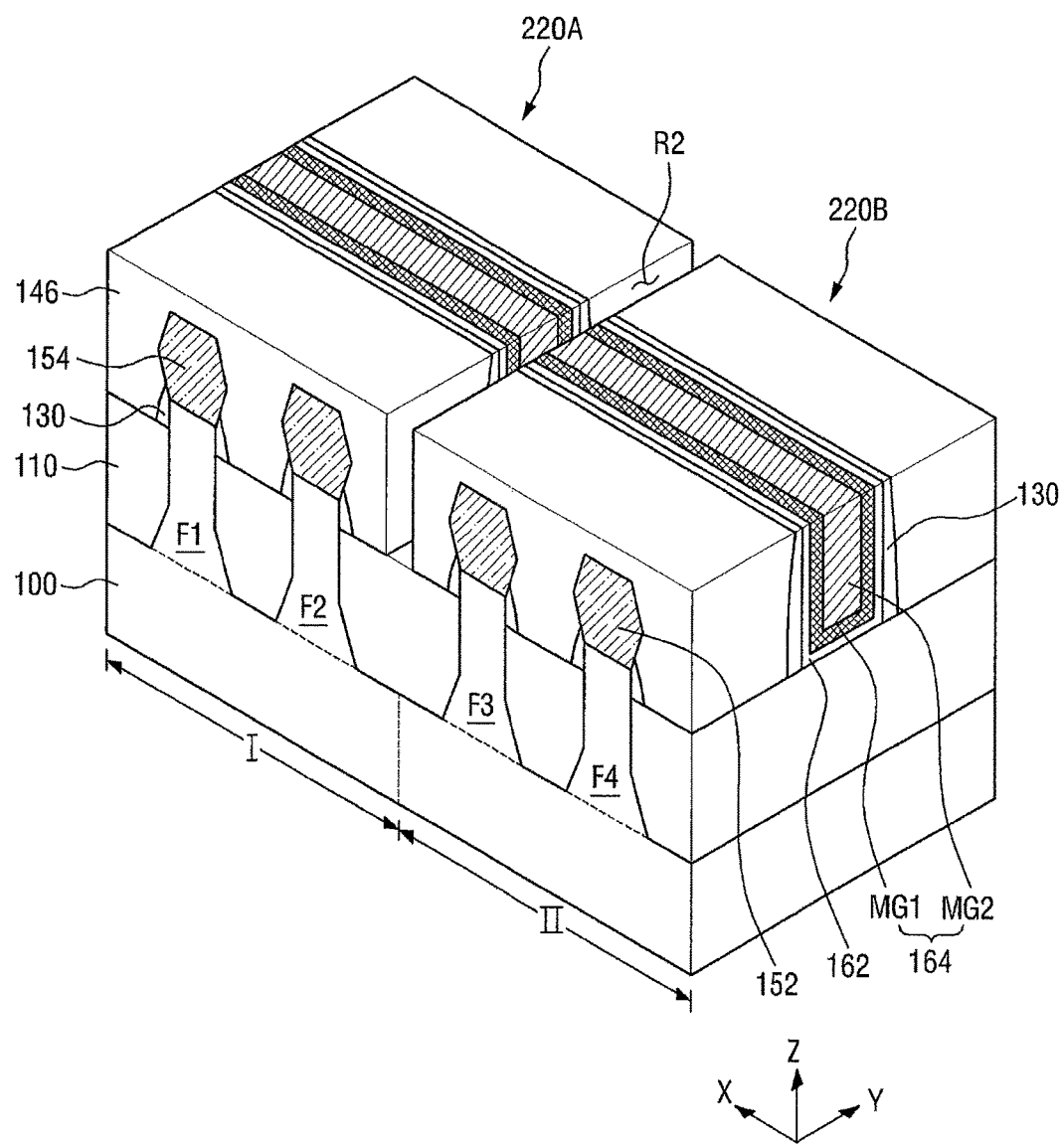

Referring to FIG. 20, a portion of the gate electrode 164 positioned between the second fin F2 and the third fin F3 is etched to expose the isolation layer 110. The gate electrode 164 may be etched in a second direction Y to expose the isolation layer 110 corresponding to a boundary between the first region I and the second region II on the substrate 100. The etching process may be an anisotropic etching process, for example, a dry etching process.

During the etching process, the gate electrode 164, the gate insulation layer 162 and the spacers 130 may be etched together. In addition, a portion of the isolation layer 110 may also be etched, and a portion of the isolation layer 110 may be exposed. In this manner, a first gate structure 220A may be formed in the first region I, a second gate structure 220B may be formed in the second region II, and a second trench R2 may be formed between the first gate structure 220A and the second gate structure 220B. The first gate structure 220A and the second gate structure 220B may be electrically disconnected from each other, and may be parts of separate transistors.

Operations for manufacturing a semiconductor device according to the second embodiments of the present inventive concept may provide substantially the same results as operations for manufacturing a semiconductor device according to the first embodiments of the present inventive concept shown in FIG. 16, but embodiments of the present inventive concept are not limited thereto.

FIGS. 21 to 29 are diagrams illustrating operations for manufacturing a semiconductor device according to third embodiments of the present inventive concept. Repeated descriptions of previously described content will be omitted, with the following description focusing on differences between the present embodiments and previously described embodiments.

Some operations for manufacturing a semiconductor device according to the third embodiments of the present inventive concept may be substantially the same as those described above for the first embodiments of the present inventive concept shown in FIGS. 1 to 10.

Figure 21:
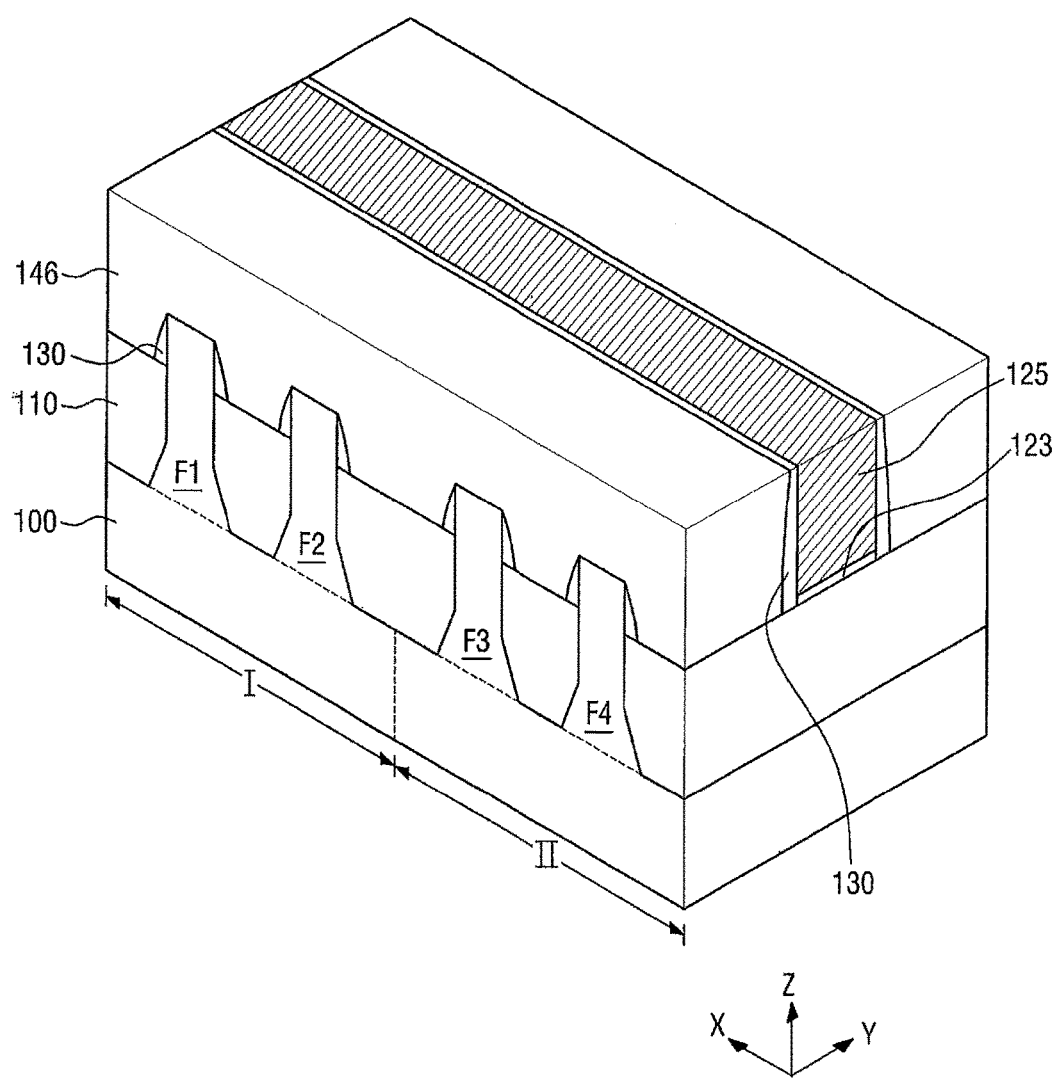
FIGS. 21 to 29 are diagrams illustrating intermediate process steps for manufacturing a semiconductor device according to third embodiments of the present inventive concept.

Referring to FIG. 21, subsequent to the operations described above with reference to FIG. 10, an interlayer insulation layer 146 is formed on the structure including the spacers 130. The interlayer insulation layer 146 may be, for example, a silicon oxide layer.

The interlayer insulation layer 146 is planarized until a top surface of a gate electrode 125 is exposed. As the result, the hard mask pattern 127 may be removed. The gate electrode 125 may be used as a dummy gate electrode.

Figure 22:
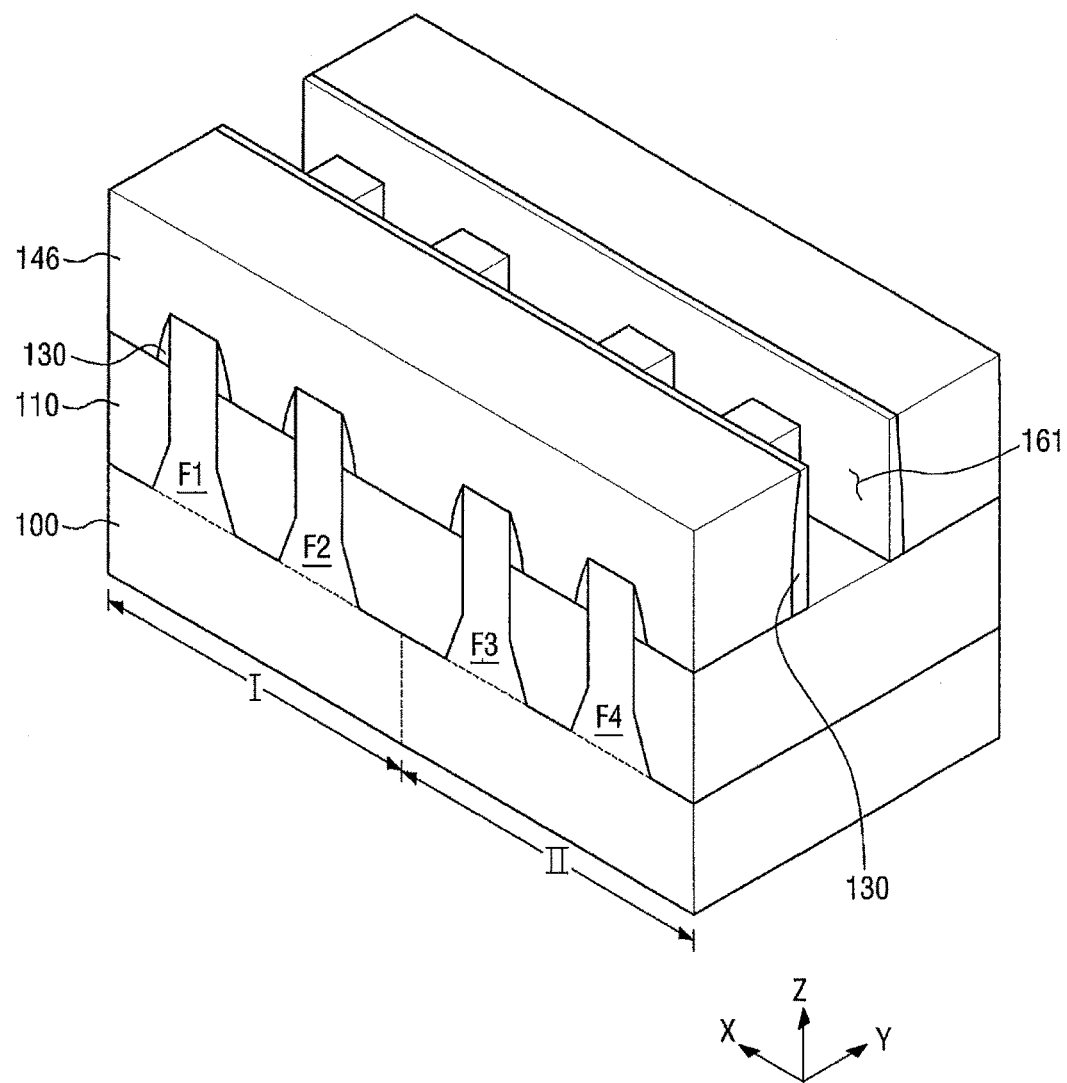

Referring to FIG. 22, the gate insulation layer 123 and the gate electrode 125 are removed, forming a trench 161 through which the isolation layer 110 and portions of fins F1 to F4 are exposed.

Figure 23:
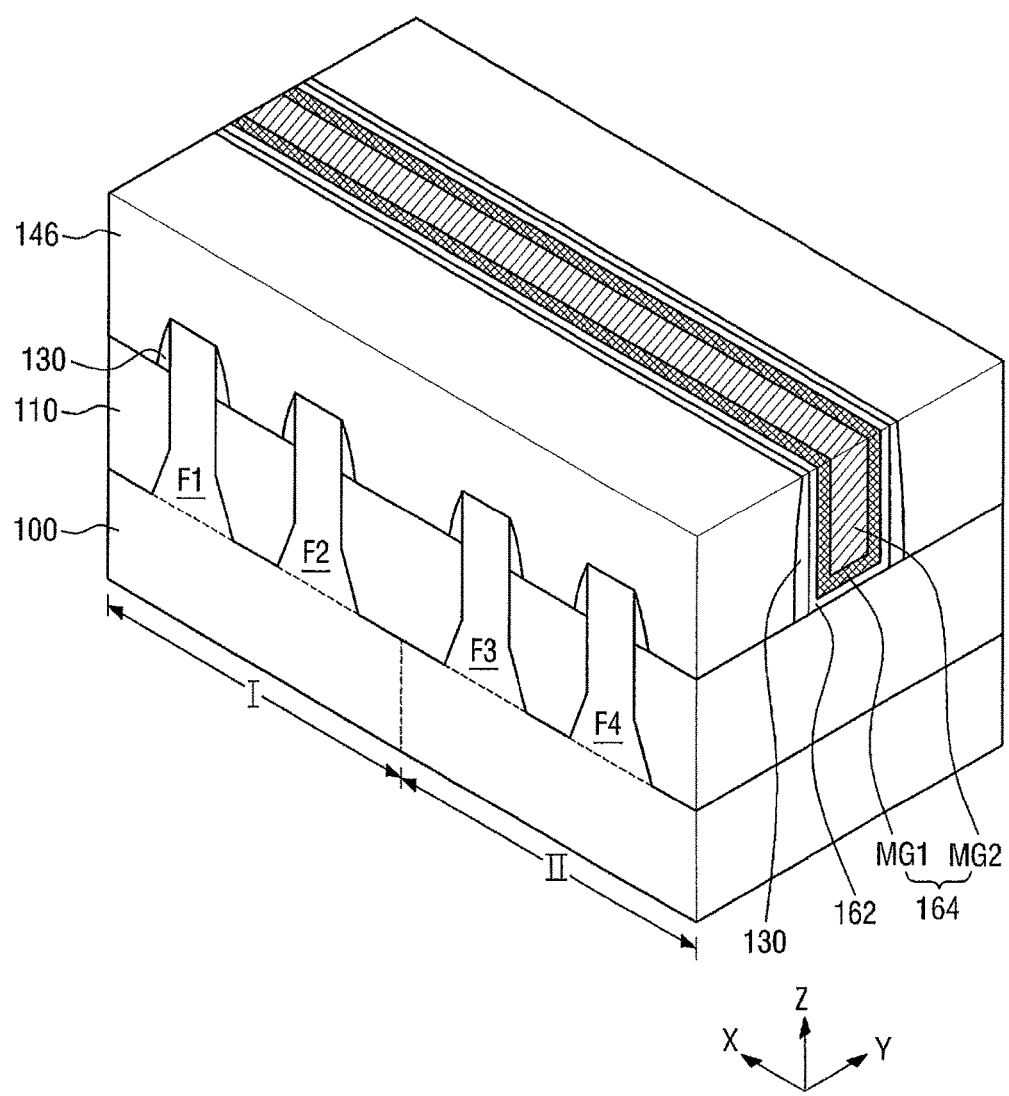

Referring to FIG. 23, a gate insulation layer 162 and a gate electrode 164 are formed in the trench 161. The gate insulation layer 162 may conform to sidewalls and a bottom surface of the trench 161. The gate electrode 164 including metal layers MG1 and MG2 may be formed on the gate insulation layer 162.

The gate electrode 164 may extend along the first direction X and cross the fins F1 to F4. The gate electrode 164 may be formed by stacking two or more metal layers MG1 and MG2. The first metal layer MG1 may function to adjust a work function, and the second metal layer MG2 may function to fill a space formed by the first metal layer MG1.

Figure 24:
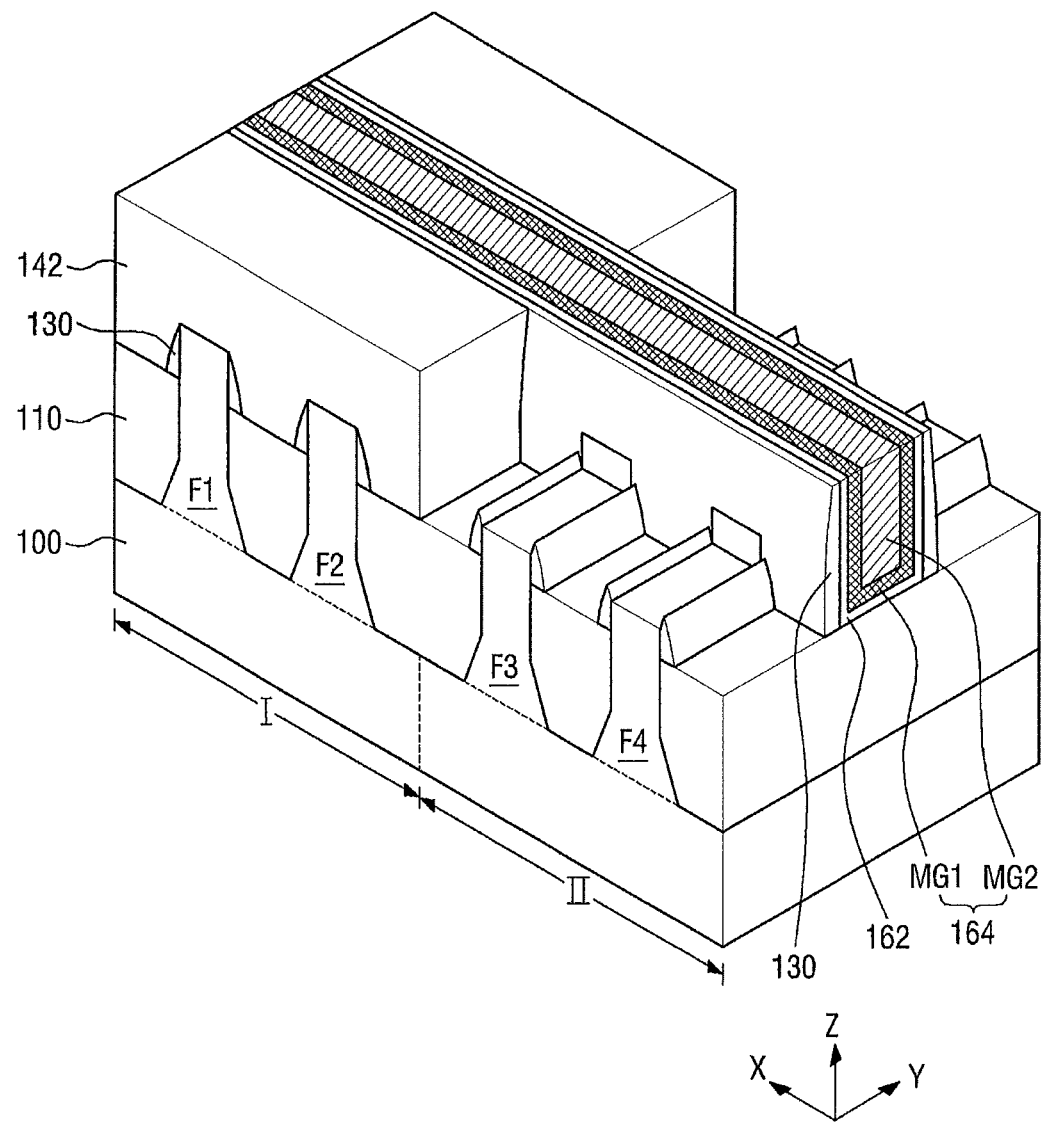
Figure 25:
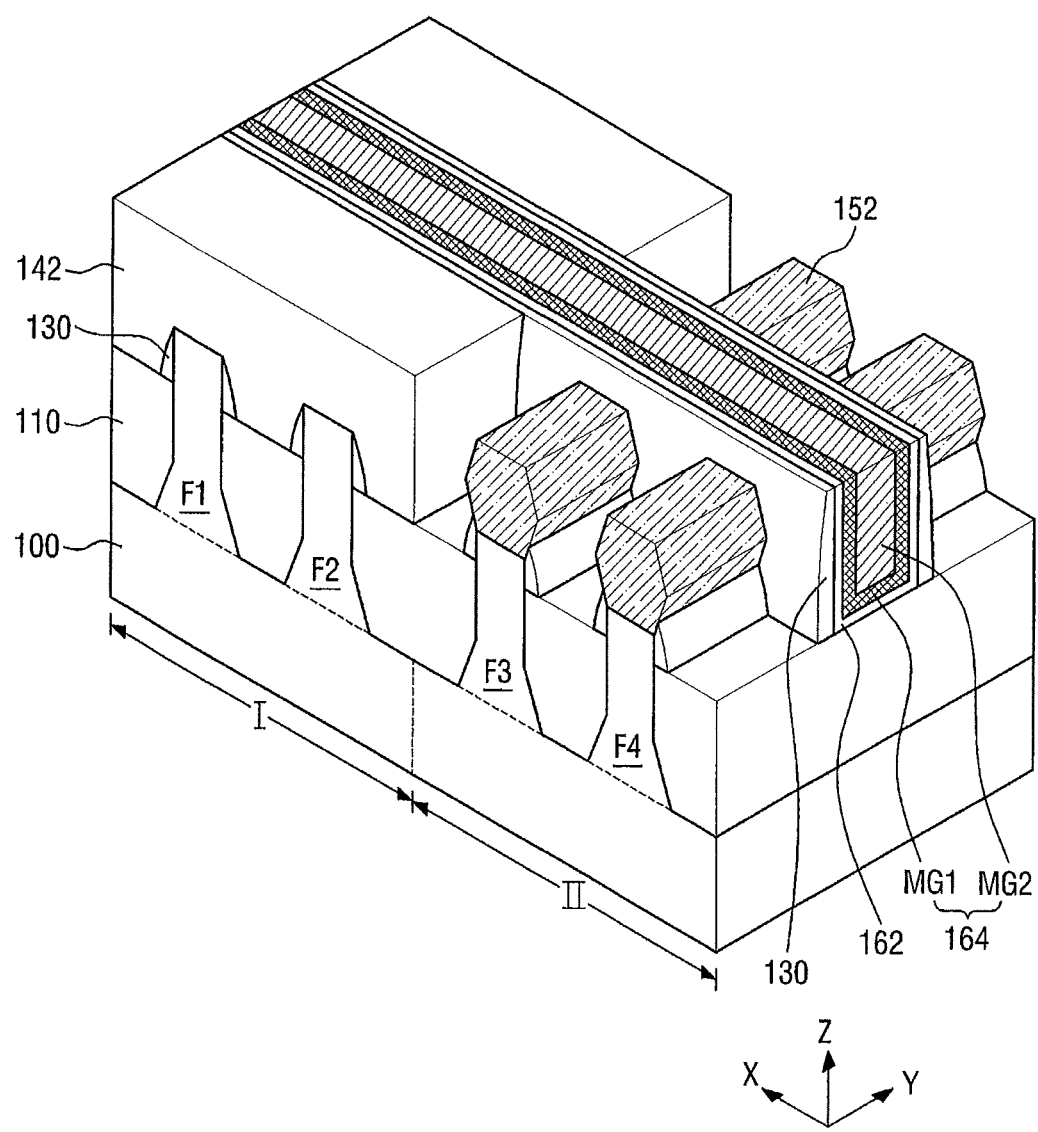

Referring to FIGS. 24 and 25, a first interlayer insulation layer 142 covering only the first region I of the substrate 100 is formed. The first interlayer insulation layer 142 may include a silicon oxide, such as borosilicate glass (BSG), phosphosilicate glass (PSG), borophosphosilicate glass (BPSG), undoped silicate glass (USG), tetraethylorthosilicate (TEOS), or high density plasma CVD (HDP-CVD) silicon oxide.

Top portions of the third fin F3 and the fourth fin F4 on the second region II of the substrate 100 are recessed, such that the third fin F3 and the fourth fin F4 positioned at opposite sides of the gate electrode 164 may have reduced heights. In the recessing, portions of the spacers 130 may be etched together with the third fin F3 and the fourth fin F4, but embodiments of the present inventive concept are not limited thereto.

First source/drain regions 152 may be formed on the top surfaces of the third fin F3 and the fourth fin F4 using epitaxial growth. The epitaxial growth may include an eSiGe process. The structure in the second region II may function as a PMOS transistor. The spacers 130 may be positioned under the first source/drain regions 152.

Figure 26:
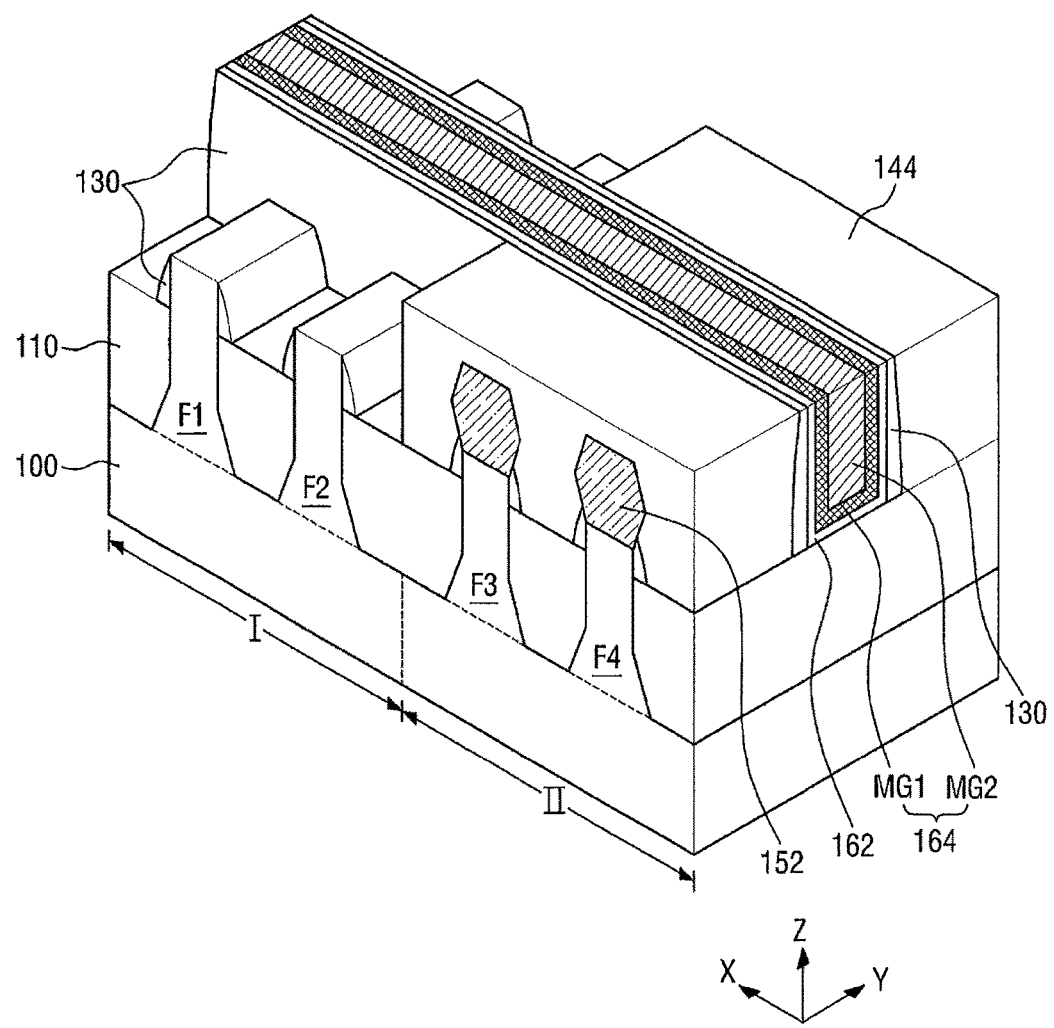
Figure 27:
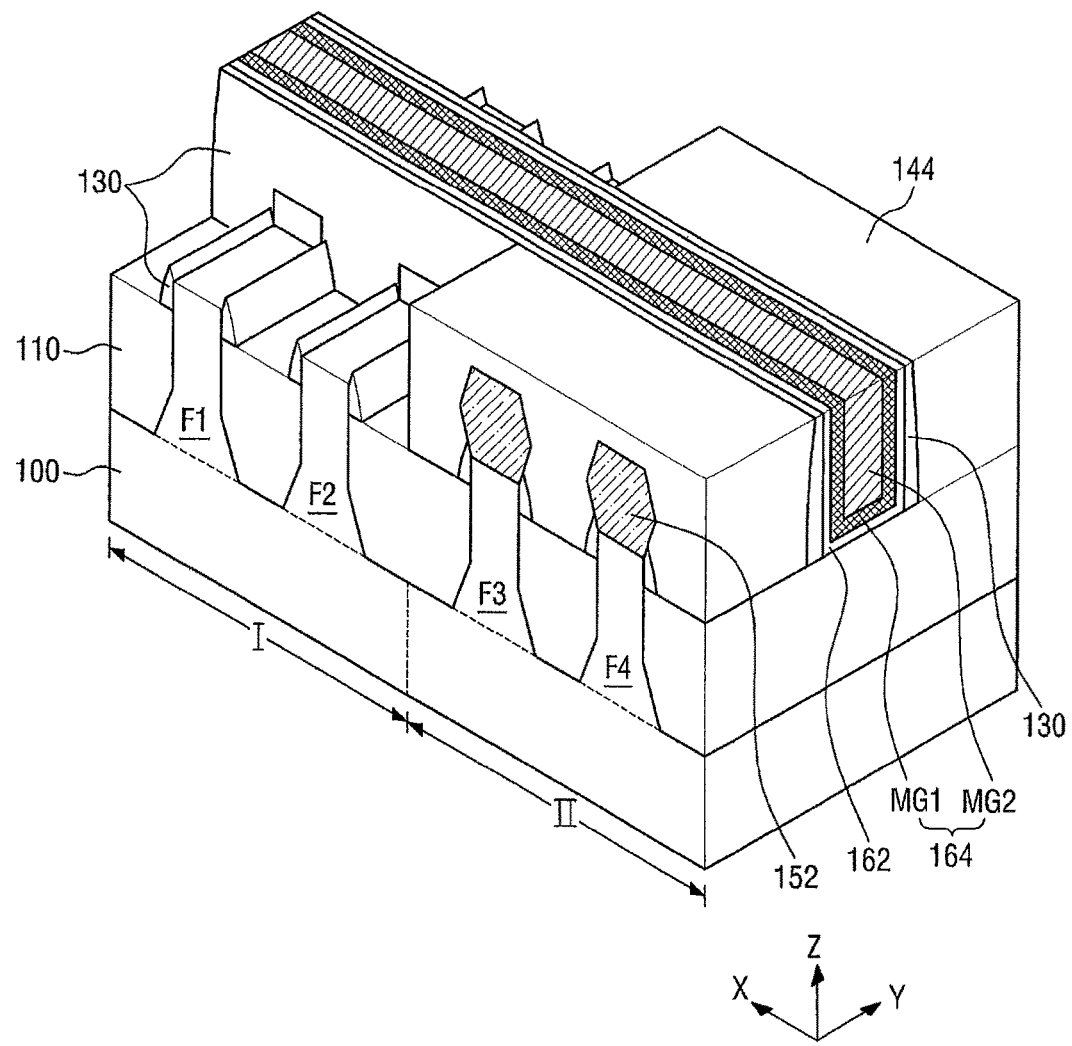
Figure 28:
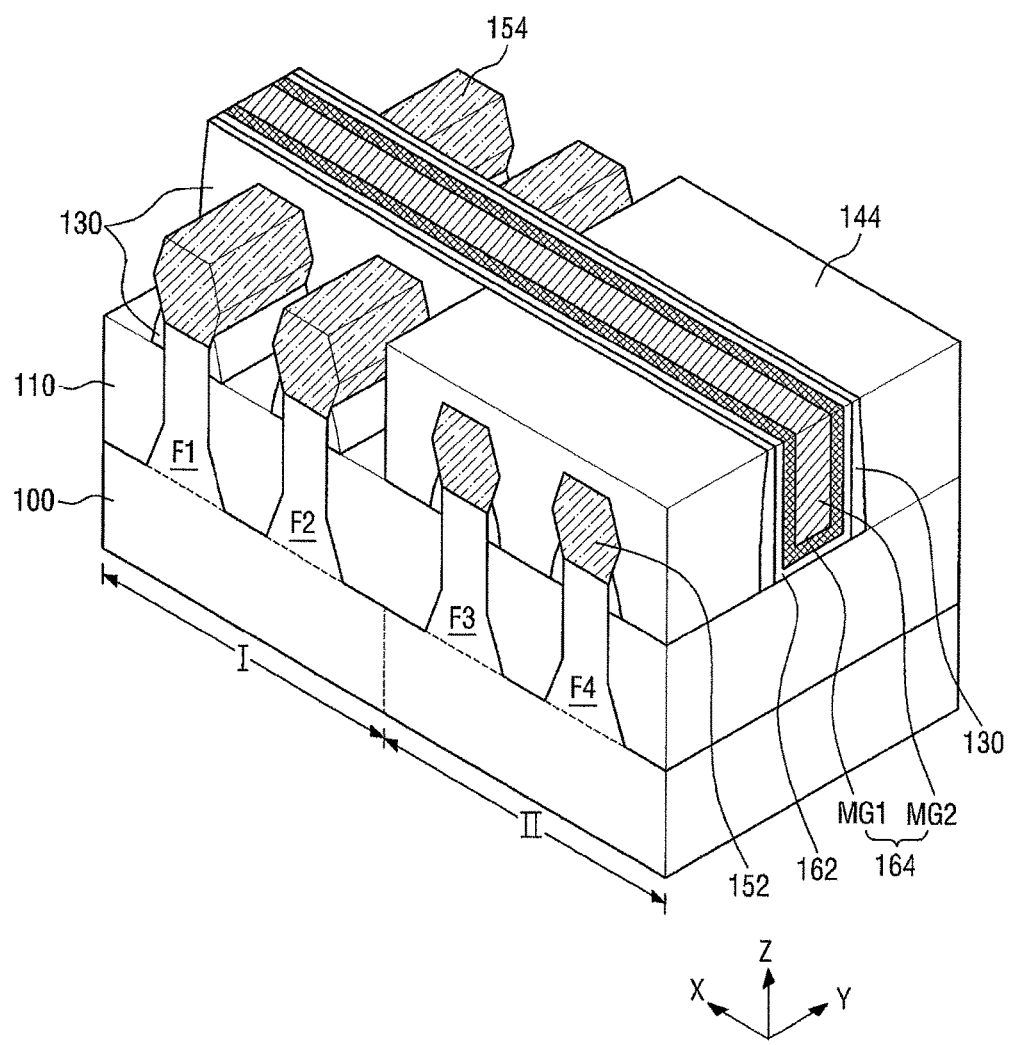

Referring to FIGS. 26 to 28, the first interlayer insulation layer 142 is removed, and a second interlayer insulation layer 144 covering only the second region II of the substrate 100 is then formed.

Top portions of the first fin F1 and the second fin F2 on the first region I of the substrate 100 are recessed. Accordingly, the first fin F1 and the second fin F2 at opposite sides of the gate electrode 164 may have reduced heights. In the recessing, portions of the spacers 130 may be etched together with the first fin F1 and the second fin F2, but embodiments of the present inventive concept are not limited thereto.

Second source/drain regions 154 may be formed on the top surfaces of the first fin F1 and the second fin F2 using epitaxial growth. The epitaxial growth may include an eSiGe process. The second source/drain region 154 may include silicon (Si) or silicon carbide (SiC). The structure formed on first region I may function as an NMOS transistor. Spacers 130 may be positioned under the second source/drain regions 154.

When the semiconductor device is a PMOS transistor, the source/drain regions 152 and 154 may include a compressive stress material. For example, the compressive stress material may be a material having a larger lattice constant than silicon (Si), such as SiGe. The compressive stress material may improve the mobility of carriers of a channel region by applying the compressive stress to the third and fourth fins F3 and F4. When the semiconductor device is an NMOS transistor, the source/drain regions 152 and 154 may include the same material as the substrate 100 or a tensile stress material. For example, when the substrate 100 includes Si, the first source/drain region 152 may include Si or a material having a smaller lattice constant than Si (e.g., SiC).

In the above-described embodiments, the PMOS transistor and the NMOS transistor are sequentially formed, but embodiments of the present inventive concept are not limited thereto. Generally, a forming sequence of the PMOS transistor and the NMOS transistor may be varied. In addition, positions of the PMOS transistor and the NMOS transistor may also be varied.

Figure 29:
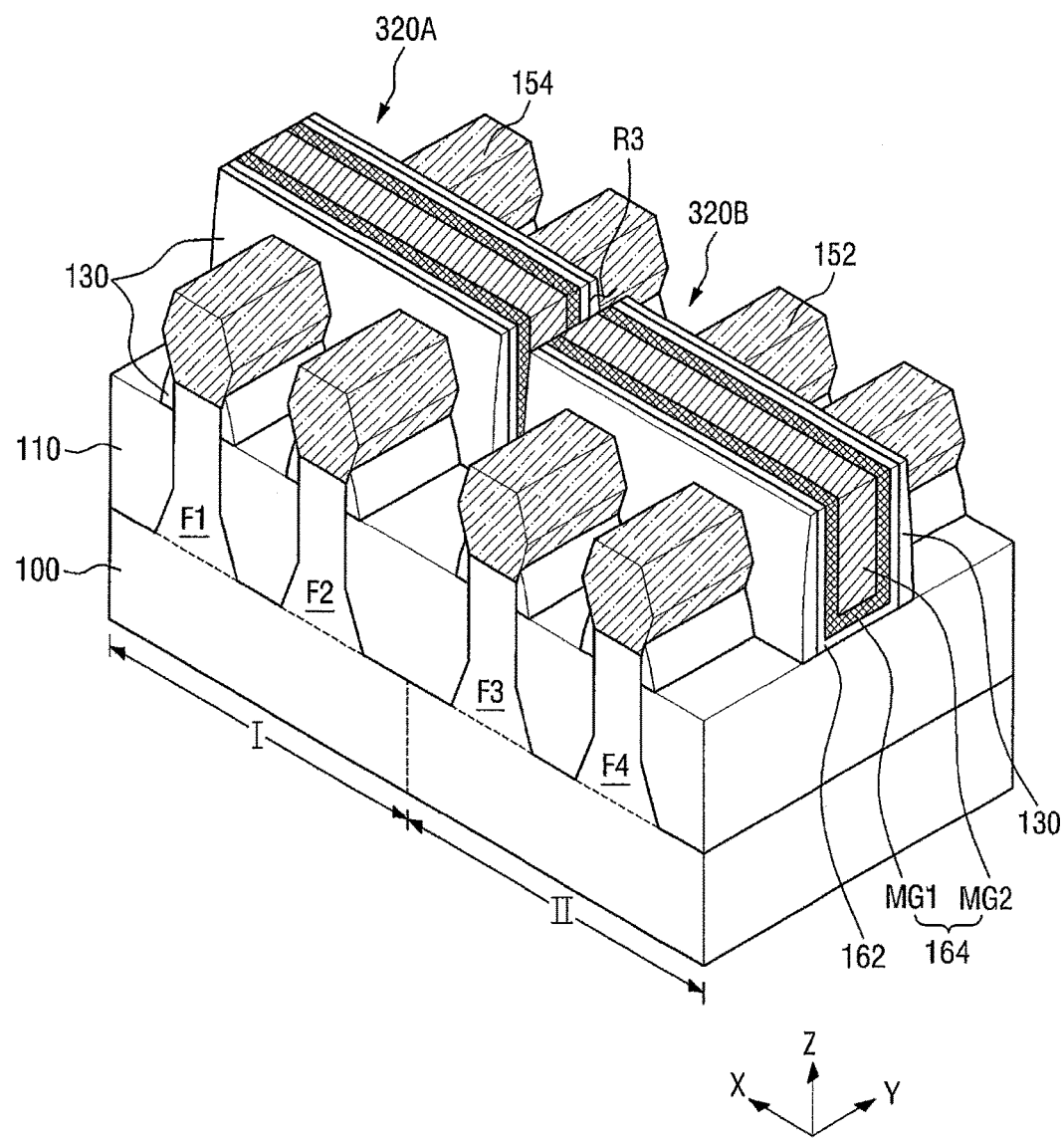

Referring to FIG. 29, the gate electrode 164 positioned between the second fin F2 and the third fin F3 may be etched to expose the isolation layer 110. The gate electrode 164 may be etched along the second direction Y to expose the isolation layer 110 at a position corresponding to a boundary between the first region I and the second region II on the substrate 100. The etching process may be an anisotropic etching process, for example, a dry etching process. During the etching process, the gate electrode 164, the gate insulation layer 162 and the spacers 130 may be etched together. In addition, the isolation layer 110 may also be etched to expose a portion of the isolation layer.

In this manner, a first gate structure 320A may be formed in the first region I, a second gate structure 320B may be formed in the second region II, and a third trench R3 may be formed between the first gate structure 320A and the second gate structure 320B. The first gate structure 320A and the second gate structure 320B may be electrically disconnected from each other, and may function as parts of separate transistors.

The operations for manufacturing a semiconductor device according to the third embodiments of the present inventive concept may produce substantially the same results as the operations for manufacturing a semiconductor device according to the first embodiments of the present inventive concept shown in FIG. 16, but embodiments of the present inventive concept are not limited thereto.

Figure 30:
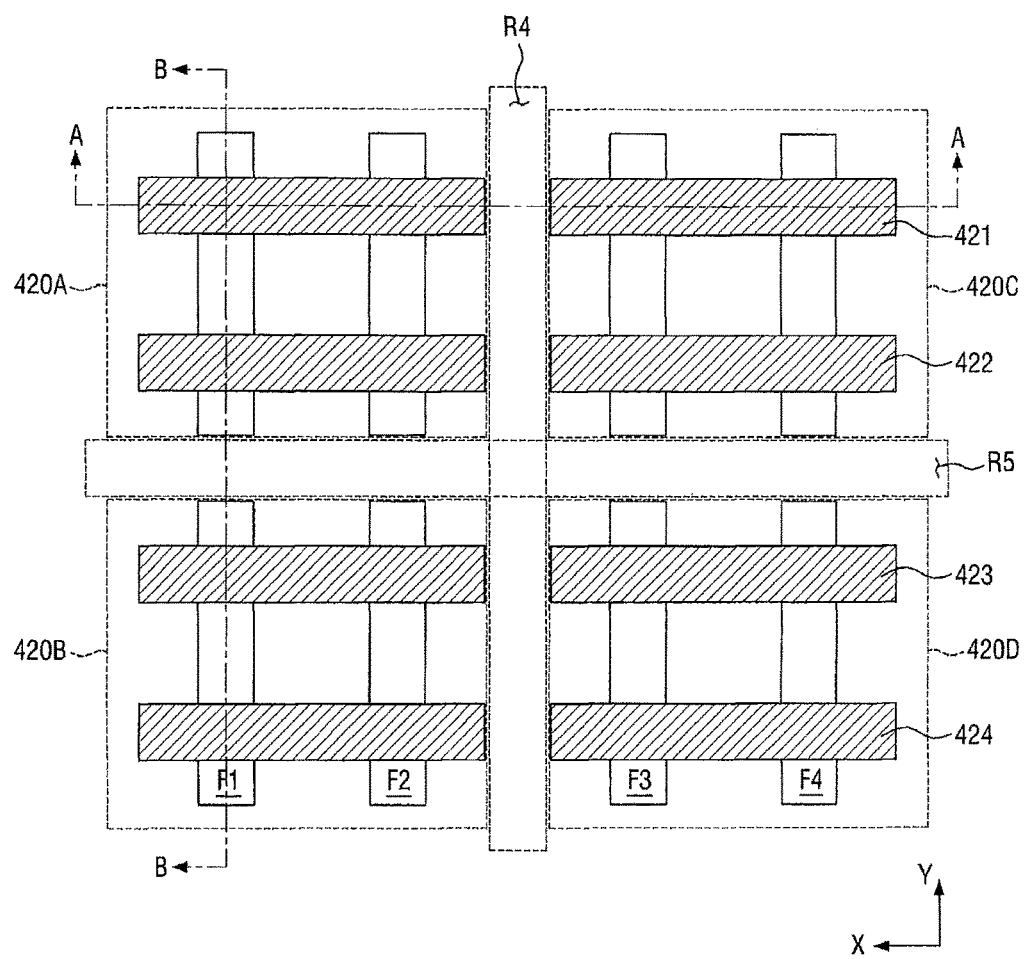
FIGS. 30 to 32 are diagrams illustrating semiconductor devices according to some example embodiments of the present inventive concept.
Figure 31:
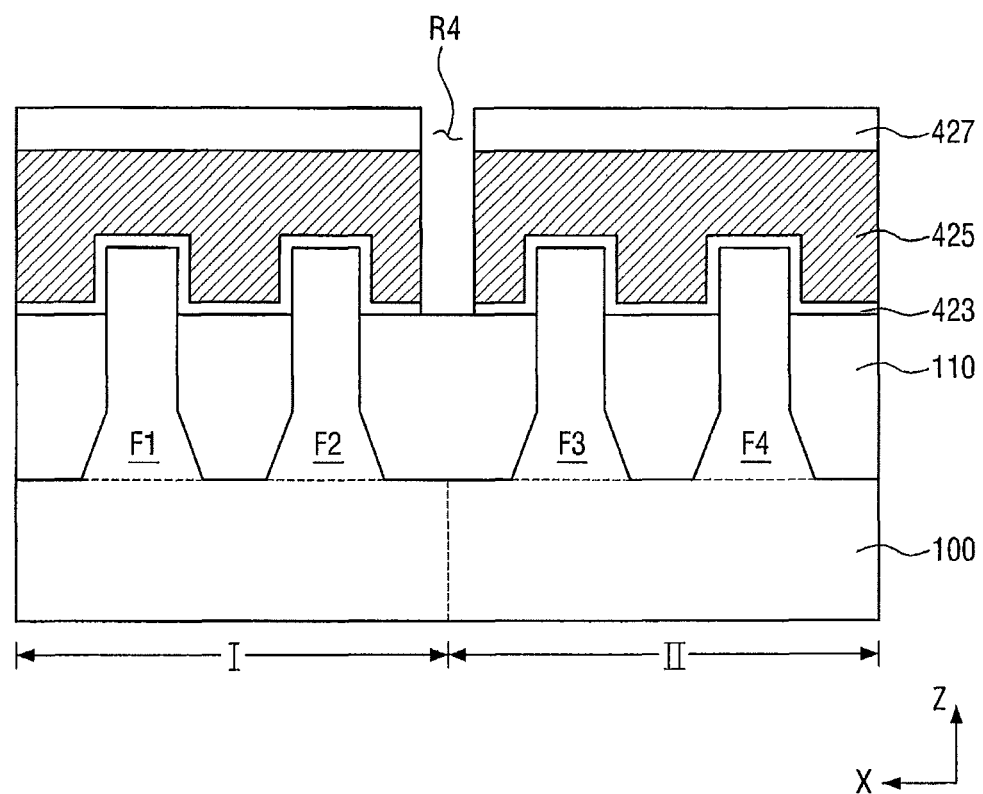
Figure 32:
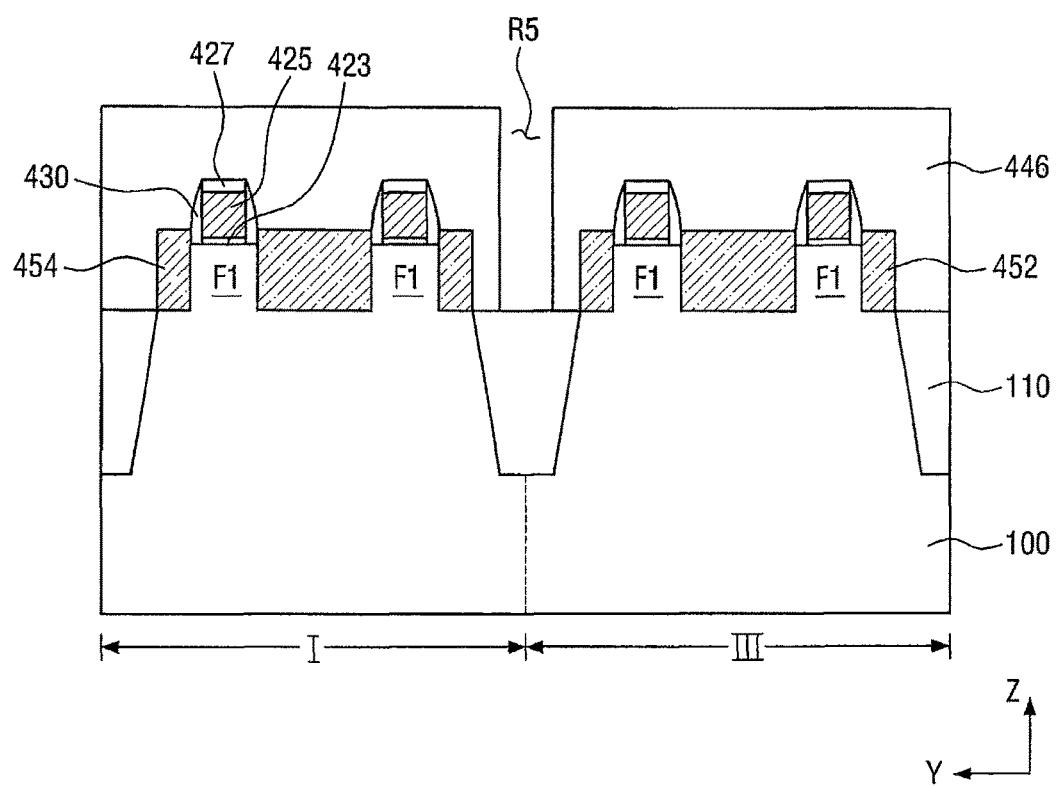

FIGS. 30 to 32 illustrate semiconductor according to some example embodiments of the present inventive concept. Repeated descriptions of previously described content will be omitted and the following description will focus on differences between the present embodiments and previously described embodiments.

FIG. 30 is a layout view of the semiconductor device. Referring to FIG. 30, the semiconductor device includes a plurality of fins F1 to F4 formed on a substrate 100 and a plurality of gate structures 421, 422, 423 and 424. The plurality of fins F1 to F4 may extend lengthwise along a second direction Y. The plurality of gate structures 421, 422, 423 and 424 may extend lengthwise along a first direction X, crossing the fins F1 to F4.

The plurality of gate structures 421, 422, 423 and 424 may be separated from each other by a fourth trench R4 or a fifth trench R5 after source/drain regions 152 and 154 are formed by epitaxial growth. The fourth trench R4 or the fifth trench R5 may be formed by an anisotropic dry etching process.

The fourth trench R4 or the fifth trench R5 may expose the isolation layer 110. In other words, the fourth trench R4 or the fifth trench R5 may extend to a top surface of the isolation layer 110. The fourth trench R4 and the fifth trench R5 may be formed so as to cross each other, but embodiments of the present inventive concept are not limited thereto.

The fourth trench R4 and the fifth trench R5 may electrically disconnect the fins F1 to F4 and the gate electrode 125 formed on the substrate 100 by the respective regions. For example, the fourth trench R4 and the fifth trench R5 may separate a first region 420A to a fourth region 420D from each other to short-circuit the device.

FIG. 31 is a cross-sectional view taken along the line A-A and FIG. 32 is a cross-sectional view taken along the line B-B. Referring to FIGS. 31 and 32, the plurality of fins F1 to F4 may be formed on the substrate 100 and the isolation layer 110 may be formed between respective ones of the plurality of fins F1 to F4. The isolation layer 110 may include STI or DTI. A top surface of the isolation layer 110 may be lower than top surfaces of the fins F1 to F4. Although not shown, more etching may occur to side portions of the isolation layer 110 near the fins F1 to F4 than to center portions of the isolation layer 110 between respective ones of the fins F1 to F4. In addition, top surfaces and lateral surfaces of the fins F1 to F4 may form acute angles, but embodiments of the present inventive concept are not limited thereto.

A gate insulation layer 423, a gate electrode 425, and a hard mask pattern 427 may be formed on the fins F1 to F4 and the isolation layer 110. A spacer 430 may be formed on sidewalls of the gate electrode 425 and sidewalls of top portions of the fins F1 to F4.

Source/drain regions 452 and 454 may be formed on at opposite sides of the gate electrode 425. The source/drain regions 452 and 454 may be formed after recessing portions of the fins F1 to F4. The fins F1 to F4 may be recessed on opposite sides of the gate electrode 425. The source/drain regions 452 and 454 may be formed at opposite sides of the gate electrode 425 using an epitaxial process. The source/drain regions 452 and 454 may come into contact with portions of the spacers 430 contacting lateral surfaces of the gate electrode 425.

An interlayer insulation layer 446 may be formed on the resultant product having the gate electrode 425 and the source/drain regions 452 and 454. A fourth trench R4 and a fifth trench R5 for short-circuiting each of transistors formed in the first to fourth regions (420A~420D) may be formed. The fourth trench R4 and the fifth trench R5 may expose a top surface of the isolation layer 110.

As described above, in a case where the fourth trench R4 and the fifth trench R5 are formed after the source/drain regions 452 and 454 are formed, the semiconductor device can be short-circuited by the respective regions. If the epitaxial growth process is performed after the short-circuiting of the semiconductor device, failures of the semiconductor device may be generated, so that characteristics of the semiconductor device may be changed as the sidewalls of the gate, source or drain are exposed during the epitaxial growth process. However, when the semiconductor device is short-circuited after the epitaxial growth process is performed, the failures can be reduced, and defects of the sidewalls of the gate can be reduced, thereby improving the performance of the semiconductor device.

Figure 33:
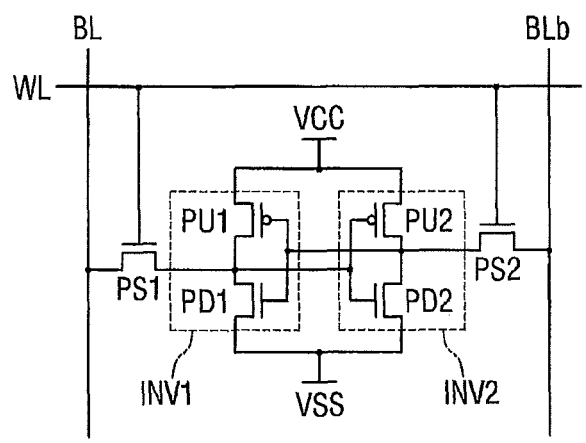
FIG. 33 is a schematic diagram illustrating a memory cell according to some example embodiments of the present inventive concept.
Figure 34:
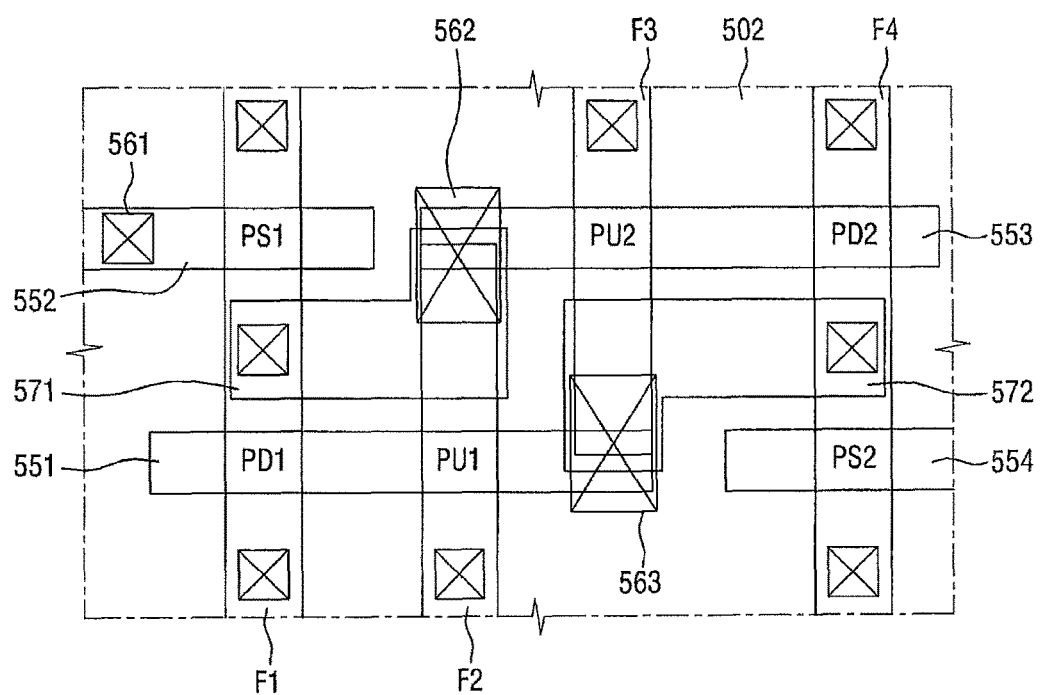
FIGS. 34 and 35 are plan views illustrating semiconductor devices according to some example embodiments of the present inventive concept.
Figure 35:
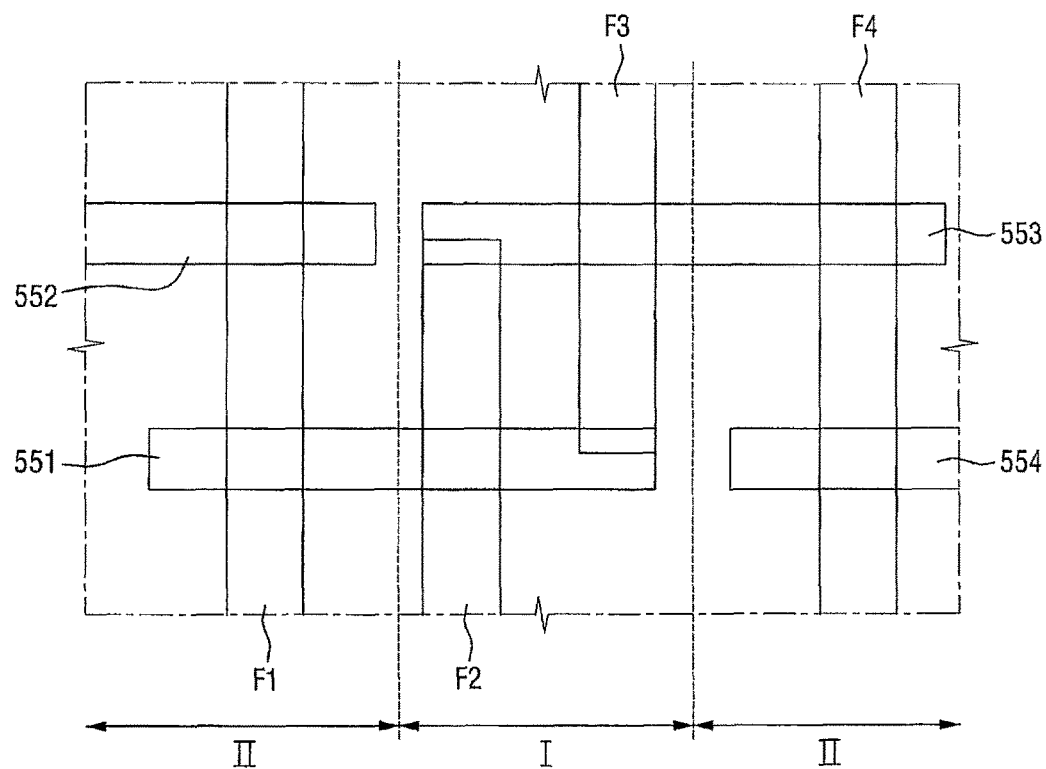

FIG. 33 is a circuit view illustrating semiconductor devices according to some example embodiments of the inventive concept and FIG. 34 is a layout view illustrating semiconductor devices according to some example embodiments of the present inventive concept. FIG. 35 illustrates selected portions of fins and gate structures from the layout view of FIG. 34. Generally, embodiments of the present inventive concept can be applied to all devices including general logic devices using fin-type transistors. However, FIGS. 33 to 35 illustrate SRAMs as an example.

Referring to FIG. 33, a semiconductor device 10 according to some example embodiments of the present inventive concept may include a pair of inverters INV1 and INV2 connected in parallel between a power supply node Vcc and a ground node Vss, and a first pass transistor PS1 and a second pass transistor PS2 connected to output nodes of the inverters INV1 and INV2. The first pass transistor PS1 and the second pass transistor PS2 may be connected to a bit line BL and a complementary bit line /BL. Gates of the first pass transistor PS1 and the second pass transistor PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first pull-up transistor PU1 and the second pull-up transistor PU2 may be PMOS transistors, and the first pull-down transistor PD1 and the second pull-down transistor PD2 may be NMOS transistors. To provide a latch circuit, an input node of the first inverter INV1 is connected to an output node of the second inverter INV2 and an input node of the second inverter INV2 is connected to an output node of the first inverter INV1.

Referring to FIGS. 33 to 35, a first fin F1, a second fin F2, a third fin F3 and a fourth fin F4 are spaced apart from one another and extend lengthwise in one direction (e.g., in an up-down direction of FIG. 34). The second fin F2 and the third fin F3 may be shorter than the first fin F1 and the fourth fin F4.

A first gate electrode 551, a second gate electrode 552, a third gate electrode 553, and a fourth gate electrode 554 extend along another direction (e.g., in a left-right direction of FIG. 34) to intersect the first fin F1 to the fourth fin F4. In detail, the first gate electrode 551 completely intersects the first fin F1 and the second fin F2 while partially overlapping an end of the third fin F3. The third gate electrode 553 completely intersects the fourth fin F4 and the third fin F3 while partially overlapping an end of the second fin F2. The second gate electrode 552 and the fourth gate electrode 554 are formed to intersect the first fin F1 and the fourth fin F4, respectively.

As shown FIG. 34, the first pull-up transistor PU1 is disposed in the vicinity of an intersection of the first gate electrode 551 and the second fin F2, the first pull-down transistor PD1 is disposed in the vicinity of an intersection of the first gate electrode 551 and the first fin F1, and the first pass transistor PS1 is disposed in the vicinity of an intersection of the second gate electrode 552 and the first fin F1. The second pull-up transistor PU2 is disposed in the vicinity of an intersection of the third gate electrode 553 and the third fin F3, the second pull-down transistor PD2 is disposed in the vicinity of an intersection of the third gate electrode 553 and the fourth fin F4, and the second pass transistor PS2 is disposed in the vicinity of an intersection of the fourth gate electrode 554 and the fourth fin F4.

Although not specifically shown, recesses may be formed at opposite sides of the respective intersections of the first to fourth gate electrodes 551-554 and the first to fourth fins F1, F2, F3 and F4, and sources/drains may be formed in the recesses. In addition, a plurality of contacts 561 may be formed.

A first shared contact 562 may connect the second fin F2, the third gate electrode F5, the third gate structure 553 and a wiring 571. A second shared contact 563 may connect the third fin F3, the first gate electrode 551 and a wiring 572.

The first pull-up transistor PU1, the first pull-down transistor PD1, the first pass transistor PS1, the second pull-up transistor PU2, the second pull-down transistor PD2, and the second pass transistor PS2 may be fabricated using semiconductor device manufacturing operations according to the example embodiments of the present inventive concept. That is to say, the respective transistors may cause short-circuits to the semiconductor devices after performing epitaxial growth on the sources or drains.

Figure 36:
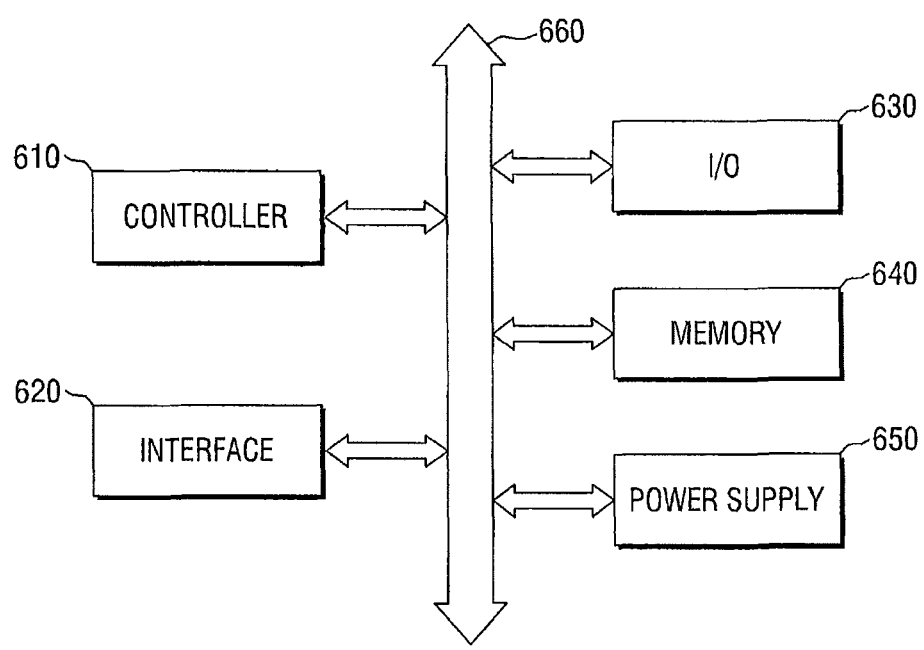
FIG. 36 is a schematic block diagram illustrating an electronic system including semiconductor devices according to some example embodiments of the present inventive concept.

Hereinafter, an electronic system including the semiconductor devices manufactured by semiconductor device manufacturing methods according to some example embodiments of the present inventive concept will be described. FIG. 36 is a schematic block diagram illustrating an electronic system including the semiconductor devices manufactured by semiconductor device manufacturing methods according to some example embodiments of the present inventive concept.

Referring to FIG. 36, the electronic system may include a controller 610, an interface 620, an input/output device (I/O) 630, a memory 640, a power supply 650 and a bus 660.

The controller 610, the interface 620, the I/O 630, the memory 640, and/or the power supply 650 may be connected to each other through the bus 660. The bus 660 corresponds to a path through which data moves.

The controller 610 may include at least one of a microprocessor, a digital signal processor, a microcontroller, and logic elements capable of functions similar to those of these elements.

The interface 620 may perform functions of transmitting data to a communication network or receiving data from the communication network. The interface 620 may be wired or wireless. For example, the interface 620 may include an antenna or a wired/wireless transceiver, and so on.

The I/O 630 may include a keypad, a display device, and so on.

The memory 640 may store data and/or commands. The semiconductor devices according to some example embodiments of the present inventive concept may be provided as some components of the memory 640.

The power supply 650 may convert externally applied power to supply the converted power to various components 610 to 640.

Figure 37:
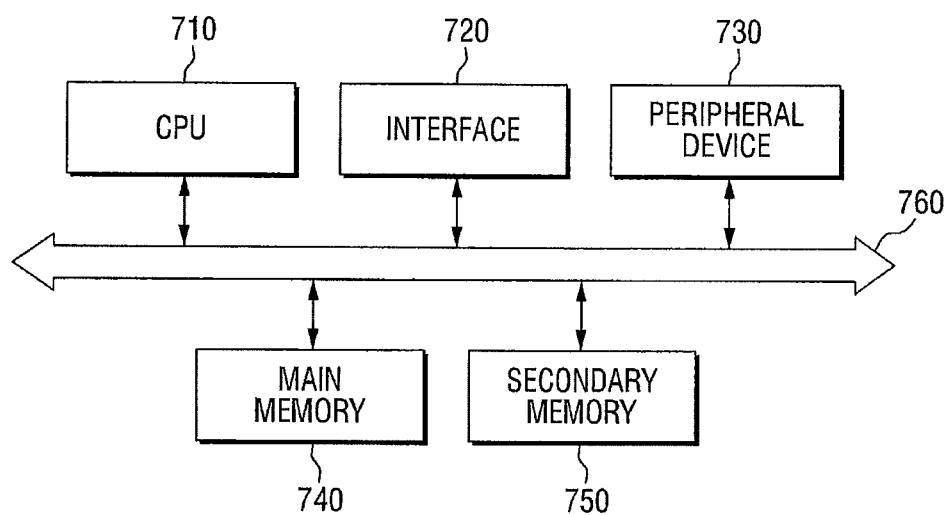
FIG. 37 is a schematic block diagram illustrating an application example of an electronic system including semiconductor devices according to some example embodiments of the present inventive concept.

FIG. 37 is a schematic block diagram illustrating an application example of an electronic system including the semiconductor devices manufactured by semiconductor device manufacturing methods according to some example embodiments of the present inventive concept.

Referring to FIG. 37, the electronic system may include a central processing unit (CPU) 710, an interface 720, a peripheral device 730, a main memory 740, a secondary memory 750, and a bus 760.

The CPU 710, the interface 720, the peripheral device 730, the main memory 740, and the secondary memory 750 may be connected to each other through the bus 760. The bus 760 may correspond to a path through which data moves.

The CPU 710, including a controller, an operation device, etc., may execute a program and process data.

The interface 720 may transmit data to a communication network or may receive data from the communication network. The interface 720 may be configured in a wired/wireless manner. For example, the interface 720 may be an antenna or a wired/wireless transceiver.

The peripheral device 730, including a mouse, a keyboard, a display device, a printer, etc., may input/output data.

The main memory 740 may transceive data to/from the CPU 710 and may store data and/or commands required to execute the program. The semiconductor memory devices according to some example embodiments of the present inventive concept may be provided as some components of the main memory 740.

The secondary memory 750, including a nonvolatile memory, such as a floppy disk, a hard disk, a CD-ROM, or a DVD, may store the data and/or commands. The secondary memory 750 may store data even in an event of power interruption of the electronic system.

Figure 38:
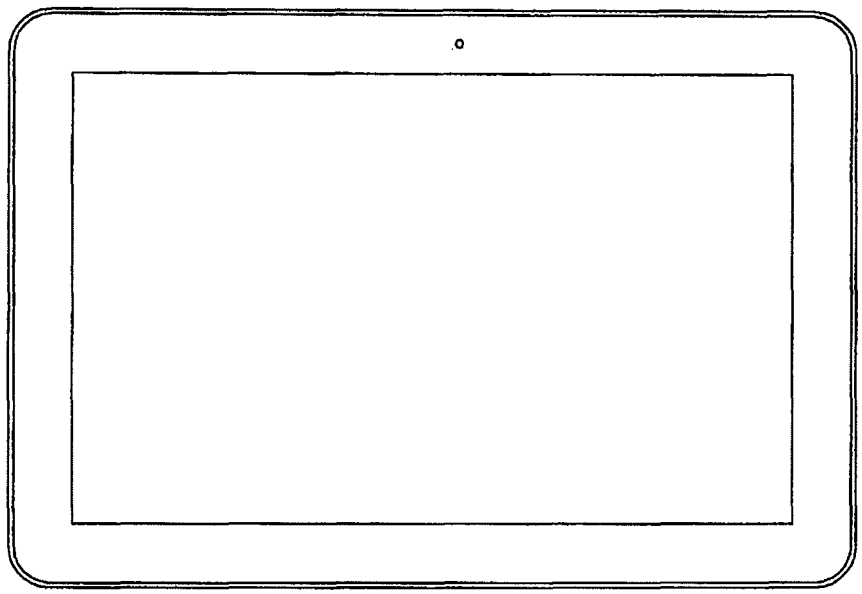
FIGS. 38 to 40 illustrate example systems including semiconductor devices according to some example embodiments of the present inventive concept.
Figure 39:
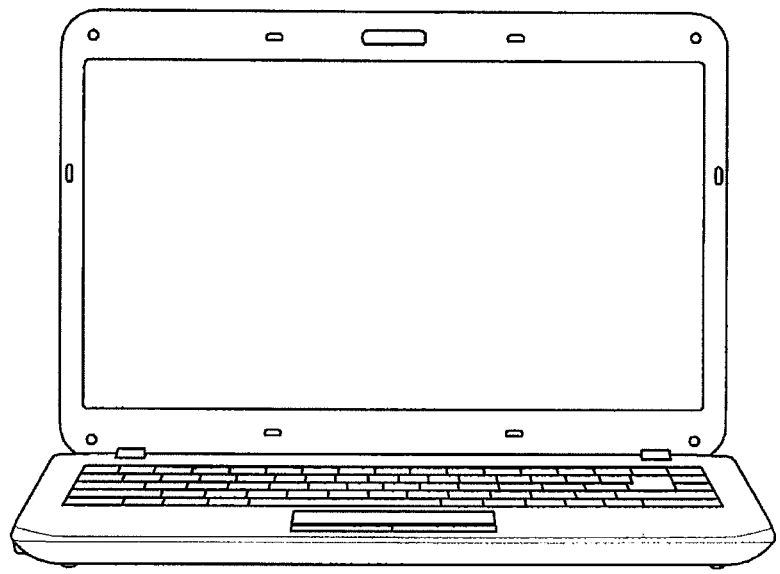
Figure 40:
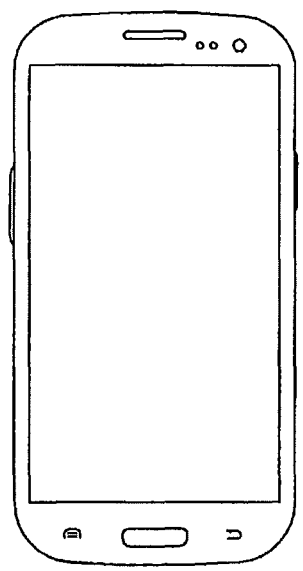

FIGS. 38 to 40 illustrate example semiconductor systems to which the semiconductor devices manufactured by semiconductor device manufacturing methods according to some exemplary embodiments of the present inventive concept can be applied.

FIG. 38 illustrates an example in which a semiconductor device according to an embodiment of the present inventive concept is applied to a tablet PC (1100), FIG. 39 illustrates an example in which a semiconductor device according to an embodiment of the present inventive concept is applied to a notebook computer (1200), and FIG. 40 illustrates an example in which a semiconductor device according to an embodiment of the present inventive concept is applied to a smart phone (1300). At least one of the semiconductor device manufacturing methods according to some example embodiments of the present inventive concept can be employed to the tablet PC 1100, the notebook computer 1200, the smart phone 1300, and the like.

It is obvious to one skilled in the art that the semiconductor device manufacturing methods according to some example embodiments of the present inventive concept may also be applied to other IC devices not illustrated herein. In the above-described example embodiments, only the tablet PC 1100, the notebook computer 1200 and the smart phone 1300 have been exemplified as the semiconductor devices according to the example embodiments of the present inventive concept, but aspects of the present inventive concept are not limited thereto. In some example embodiments of the present inventive concept, the nonvolatile memory system may be implemented as a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, or a device capable of transmitting/receiving information in wireless environments, one of various electronic devices constituting a home network, one of various electronic devices constituting a computer network, one of various electronic devices constituting a telematics network, RFID devices, or embedded computing systems.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present exemplary embodiments be considered in all respects as illustrative and not restrictive, reference being made to the appended claims rather than the foregoing description to indicate the scope of the invention.

What is claimed is:

1. A method of manufacturing a semiconductor device, the method comprising:
   forming spaced apart first and second fins on a substrate;
   forming an isolation layer on the substrate between the first and second fins;
   forming a dummy gate on the isolation layer and crossing the first and second fins;
   forming spacers on lateral surfaces of the first and second fins;
   forming source/drain regions on the first and second fins on first and second sides of the dummy gate;
   removing the dummy gate to form a trench;
   forming a gate structure in the trench; and
   after forming the source/drain regions, removing a portion of the gate structure between the first and second fins to form respective first and second gate structures crossing respective ones of the first and second fins and a first trench between the first and second gate structures.

2. The method of claim 1, wherein the gate structure comprises a gate insulation layer, a first metal layer and a second metal layer, and wherein the gate structure is formed after formation of the source drain regions.

3. The method of claim 1, wherein removing a portion of the gate structure between the first and second fins to form respective first and second gate structures crossing respective ones of the first and second fins and a first trench between the first and second gate structures comprises anisotropic dry etching the gate structure.

4. The method of claim 1, wherein the source/drain regions extend over the spacers.

5. The method of claim 1:
   wherein forming the dummy gate comprises:
   forming a dummy gate insulation layer on the first and second fins;
   forming a dummy gate electrode layer on the dummy gate insulation layer;
   forming a hard mask layer on the dummy gate electrode layer;
   patterning the hard mask layer to form a hard mask pattern; and
   patterning the gate insulation layer and the gate electrode layer using the hard mask pattern as a mask to form a dummy gate electrode.

6. The method of claim 5:
   wherein removing the dummy gate is preceded by forming an interlayer insulation layer on the hard mask layer and the source/drain regions; and
   wherein removing the dummy gate comprises:
   planarizing the interlayer insulation layer to remove the hard mask layer and expose the dummy gate electrode; and
   removing the dummy gate electrode and the dummy gate insulation layer to form the trench.

7. The method of claim 5, further comprising forming spacers on lateral surfaces of the dummy gate electrode and the hard mask pattern before forming the source/drain regions.

8. The method of claim 1, further comprising forming spacers on lateral surfaces of the dummy gate concurrent with forming the spacers on the lateral surfaces of the first and second fins.

9. The method of claim 1:
   wherein forming source/drain regions is preceded by removing portions of the first and second fins to recess upper surfaces of the first and second fins between the spacers; and
   wherein forming source/drain regions comprises forming the source/drain regions on the recessed upper surfaces of the first and second fins.

10. The method of claim 9, wherein the source/drain regions extend over the spacers.

* * * * *